(12) United States Patent
Cho et al.

(10) Patent No.: US 12,236,129 B2
(45) Date of Patent: Feb. 25, 2025

(54) MEMORY MODULE AND MEMORY SYSTEM INCLUDING THE SAME

(71) Applicant: SAMSUNG ELECTRONICS CO., LTD., Suwon-si (KR)

(72) Inventors: Jungwoong Cho, Gyeongju-si (KR); Joonkun Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 239 days.

(21) Appl. No.: 17/827,838

(22) Filed: May 30, 2022

(65) Prior Publication Data

US 2023/0153018 A1  May 18, 2023

(30) Foreign Application Priority Data

Nov. 15, 2021   (KR) ......................... 10-2021-0156359

(51) Int. Cl.
   *G06F 3/06*  (2006.01)
(52) U.S. Cl.
   CPC .......... *G06F 3/0655* (2013.01); *G06F 3/0604* (2013.01); *G06F 3/0673* (2013.01)
(58) Field of Classification Search
   CPC .... G06F 3/0655; G06F 3/0604; G06F 3/0673; G11C 2029/0411; G11C 2029/5002; G11C 5/147; G11C 29/028; G11C 5/04; G11C 7/1006; G11C 7/04
   See application file for complete search history.

(56) References Cited

U.S. PATENT DOCUMENTS

| | | |
|---|---|---|
| 7,260,007 B2 | 8/2007 | Jain et al. |
| 7,830,690 B2 | 11/2010 | Santos et al. |
| 7,965,571 B2 | 6/2011 | Jeong et al. |
| 7,984,250 B2 | 7/2011 | Steinbrecher et al. |
| 9,465,757 B2 | 10/2016 | Son et al. |
| 9,703,298 B2 | 7/2017 | Sato |
| 9,746,383 B2 | 8/2017 | Hsu et al. |

(Continued)

FOREIGN PATENT DOCUMENTS

| | | |
|---|---|---|
| DE | 102006019749 A1 | 7/2007 |
| JP | 20110138550 A | 7/2011 |

(Continued)

*Primary Examiner* — Francisco A Grullon
(74) *Attorney, Agent, or Firm* — Fish & Richardson P.C.

(57) ABSTRACT

A memory system includes a memory module and a memory controller. The memory module includes a control device, a module temperature sensor configured to measure a module temperature and a plurality of semiconductor memory devices configured to store data. The plurality of semiconductor memory devices respectively include a plurality of temperature measurement circuits configured to measure a plurality of internal temperatures respectively corresponding to the plurality of semiconductor memory devices. The memory system is configured to generate a reference offset value based on the module temperature and the plurality of internal temperatures and perform a thermal throttling of the memory module based on the reference offset value and the module temperature. Physical damage to the semiconductor memory devices is reduced by dynamically generating the reference offset value based on the real internal temperatures of the semiconductor memory devices to perform the thermal throttling based on the reference offset value.

18 Claims, 24 Drawing Sheets

(56) References Cited

U.S. PATENT DOCUMENTS

| | | |
|---|---|---|
| 9,778,664 B2 | 10/2017 | Santos et al. |
| 10,446,217 B2 | 10/2019 | Park |
| 10,725,682 B2 | 7/2020 | Kim et al. |
| 10,890,931 B2 | 1/2021 | Santos et al. |
| 2007/0018299 A1* | 1/2007 | Koo .................... G11C 5/02 |
| | | 257/E25.023 |
| 2007/0211548 A1* | 9/2007 | Jain ................ G06F 11/3058 |
| | | 365/211 |
| 2010/0064099 A1* | 3/2010 | Nishtala ............ G06F 13/385 |
| | | 711/E12.083 |
| 2011/0138091 A1* | 6/2011 | Housty .............. G06F 9/4401 |
| | | 710/113 |
| 2018/0245986 A1* | 8/2018 | Pan .................... G06F 1/206 |
| 2019/0237152 A1* | 8/2019 | Lee ..................... G11C 29/38 |
| 2020/0089292 A1* | 3/2020 | North ................. G06F 1/206 |
| 2020/0279588 A1 | 9/2020 | Lym et al. |
| 2022/0059141 A1* | 2/2022 | Hong ................. G11C 7/1078 |
| 2023/0076481 A1* | 3/2023 | Tang ................ G06F 3/0673 |

FOREIGN PATENT DOCUMENTS

| | | |
|---|---|---|
| JP | 20140096188 A | 5/2014 |
| KR | 832029 A | 4/2008 |
| KR | 20110111445 A | 10/2011 |

\* cited by examiner

MEMORY MODULE AND MEMORY SYSTEM INCLUDING THE SAME

CROSS-REFERENCE TO RELATED APPLICATION

This U.S. non-provisional application claims priority under 35 USC § 119 to Korean Patent Application No. 10-2021-0156359, filed on Nov. 15, 2021, in the Korean Intellectual Property Office (KIPO), the disclosure of which is incorporated by reference herein in its entirety.

BACKGROUND OF THE INVENTION

1. Technical Field

Exemplary embodiments relate generally to semiconductor integrated circuits, and more particularly to a memory module performing a dynamic thermal throttling and a memory system including a memory module.

2. Discussion of the Related Art

When the operational temperature of a semiconductor memory device increases excessively, physical damage may occur and the damaged semiconductor memory device becomes unusable. In general, temperature throttling may be performed at a system level to adjust the operational temperature of the semiconductor memory device. However, temperature throttling is based on a temperature measured by a sensor such as a TSOD (Temperature Sensor On DIMM (Dual In-ling Memory Module)) that is disposed outside the semiconductor memory device, which cannot reflect the exact temperature of the semiconductor memory device. Conventionally, to reflect the real temperature of the semiconductor memory device, the thermal throttling has been performed such that the operational temperature is corrected by applying offset values of the basic input and output system (BIOS) provided by a host device (e.g., a central processing unit (CPU)). In this case, such fixed offset values may not reflect the exact operational temperature that depends on thermal characteristics, memory capacity, cooling environments (e.g., airflow, interference) of a memory system. It the thermal throttling is performed based on inexact temperature information, the probability of physical damage to the semiconductor memory device may be increased.

SUMMARY OF THE INVENTION

Some exemplary embodiments may provide a memory module, a memory system including a memory module and associated methods, capable of efficiently performing thermal throttling.

According to exemplary embodiments, a memory system includes a memory module and a memory controller configured to control the memory module. The memory module includes a control device, a module temperature sensor configured to measure a module temperature and a plurality of semiconductor memory devices configured to store data. The plurality of semiconductor memory devices respectively include a plurality of temperature measurement circuits configured to measure a plurality of internal temperatures respectively corresponding to the plurality of semiconductor memory devices. The memory system is configured to generate a reference offset value based on the module temperature and the plurality of internal temperatures and perform thermal throttling of the memory module based on the reference offset value and the module temperature.

According to exemplary embodiments, a memory module includes a module substrate, a control device mounted on the module substrate, a module temperature sensor mounted on the module substrate and configured to measure a module temperature, and a plurality of semiconductor memory devices mounted on the module substrate and configured to store data. The plurality of semiconductor memory devices respectively include a plurality of temperature measurement circuits configured to measure a plurality of internal temperatures corresponding to the plurality of semiconductor memory devices. The memory module is configured to provide information on a reference offset value to a memory controller, the reference offset value corresponding to a maximum internal temperature of the plurality of internal temperatures subtracted by the module temperature.

According to exemplary embodiments, a method of operating a memory system, includes, measuring a module temperature using a module temperature sensor that is mounted on a memory module, measuring a plurality of internal temperatures respectively corresponding to a plurality of semiconductor memory devices using a plurality of temperature measurement circuits that are respectively included in the plurality of semiconductor memory devices, generating a reference offset value based on the module temperature and the plurality of internal temperatures, and performing a thermal throttling of the memory module based on the reference offset value and the module temperature.

The memory module, the memory system and the method of operating a memory system according to exemplary embodiments may reduce physical damage to the semiconductor memory devices and enhance the performance and lifetime of the memory module and the memory system by dynamically generating the reference offset value based on the real internal temperatures of the semiconductor memory devices to perform the thermal throttling based on the reference offset value.

BRIEF DESCRIPTION OF THE DRAWINGS

Exemplary embodiments of the present disclosure will be more clearly understood from the following detailed description taken in conjunction with the accompanying drawings.

DETAILED DESCRIPTION OF THE PREFERRED EMBODIMENTS

Figure 1:
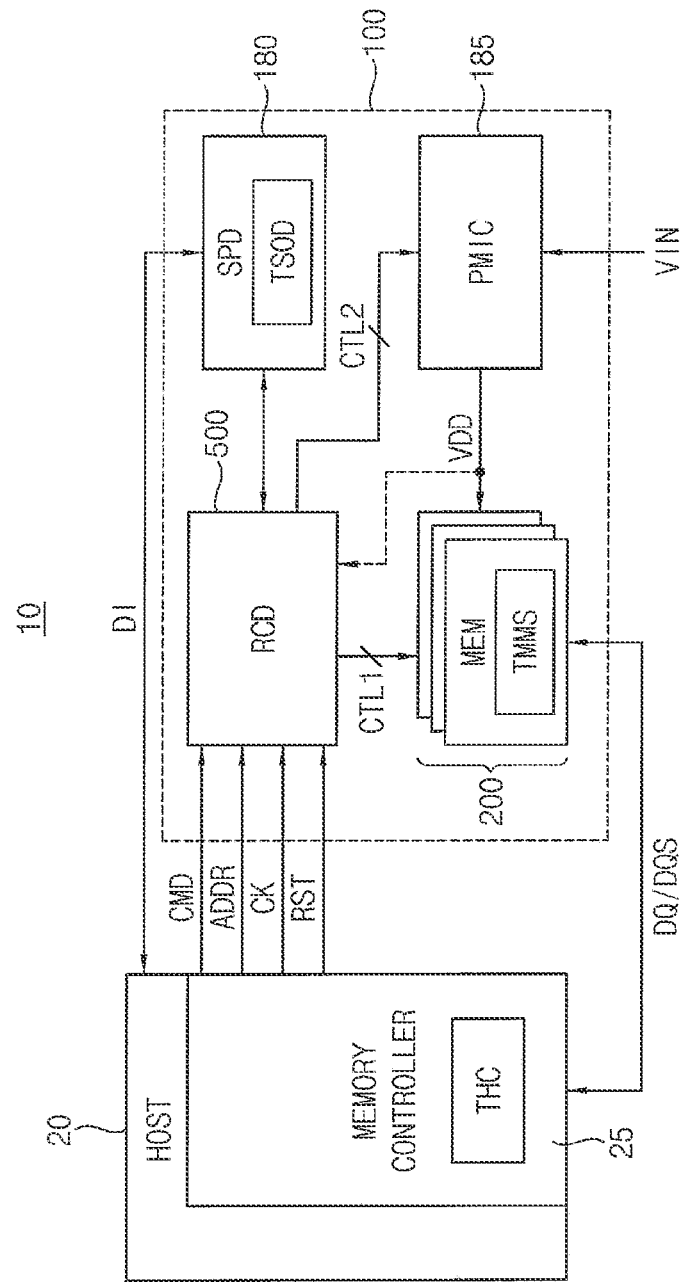
FIG. 1 is a block diagram illustrating a memory system according to exemplary embodiments.

Various exemplary embodiments will be described more fully hereinafter with reference to the accompanying drawings, in which some exemplary embodiments are shown. In the drawings, like numerals refer to like elements throughout. Repeated descriptions may be omitted as redundant.

Figure 2:
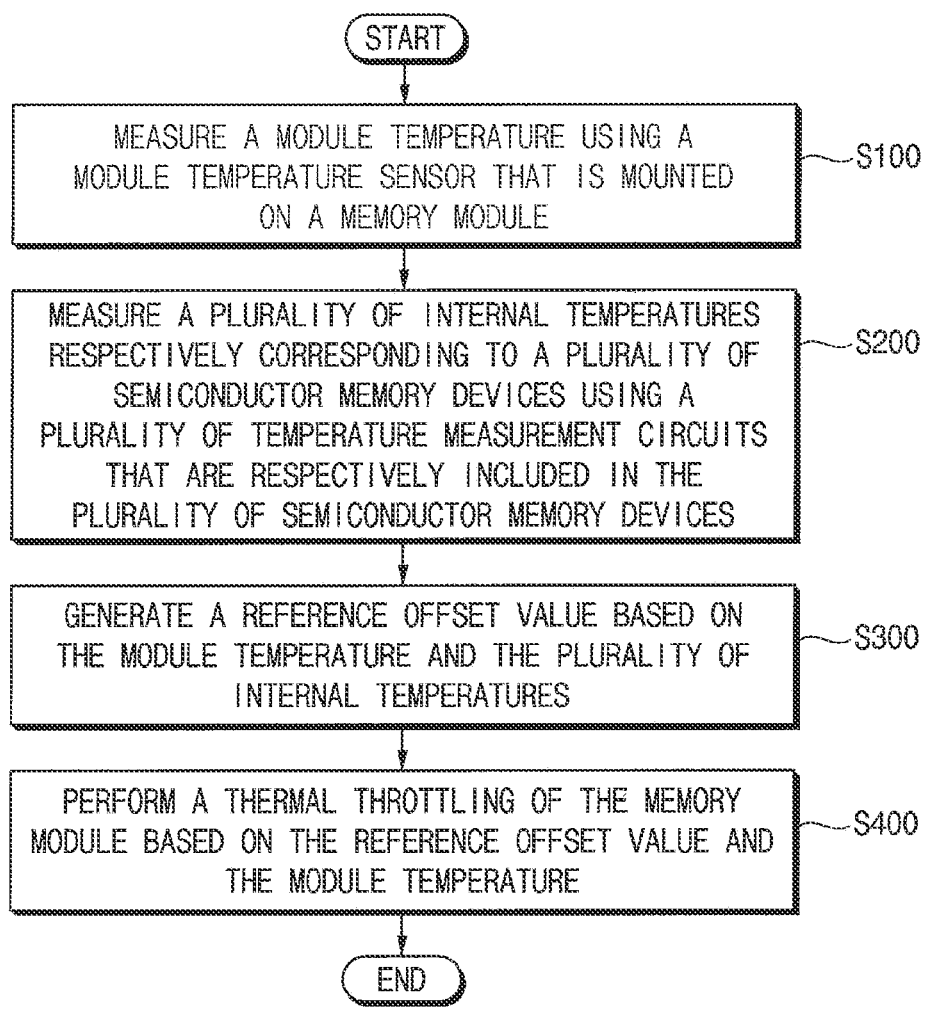
FIG. 2 is a flowchart illustrating a method of operating a memory system according to exemplary embodiments.

FIG. 1 is a block diagram illustrating a memory system according to exemplary embodiments, and FIG. 2 is a flowchart illustrating a method of operating a memory system according to exemplary embodiments.

Referring to FIG. 1, a memory system 10 includes a host device 20 and a memory module 100. The host device 20 may include a memory controller 25 configured to control the memory module 100.

The memory module 100 may include a control device 500, a plurality of semiconductor memory devices MEM 200, a serial presence detect (SPD) chip 180, a power management integrated circuit (PMIC) 185. In some exemplary embodiments, the control device 500 may be a registered clock driver (RCD). The semiconductor memory devices 200 may be referred to as semiconductor memory chips.

The control device 500 may control the semiconductor memory devices 200 and the PMIC 185 under control of the memory controller 25. For example, the control device 500 may receive an address ADDR, a command CMD, a reset signal RST and a clock signal CK from the memory controller 25. In response to received signals, the control device 500 may control the semiconductor memory devices 200 through a first control signal CTL1 and may control the PMIC 185 through a second control signal CTL2.

In response to received signals, the control device 500 may control the semiconductor memory devices 200 such that data received through a data signal DQ and a data strobe signal DQS is written in the semiconductor memory devices 200 or such that data stored in the semiconductor memory devices 200 is outputted through the data signal DQ and the data strobe signal DQS.

For example, the control device 500 may transmit the address ADDR, the command CMD, the reset signal RST and the clock signal CK from the memory controller 25 to the semiconductor memory devices 200 as the first control signal CTL1.

The semiconductor memory devices 200 may store data received through the data signal DQ and the data strobe signal DQS under control of the control device 500. Alternatively, the semiconductor memory devices 200 may output the written data through the data signal DQ and the data strobe signal DQS under control of the control device 500.

The semiconductor memory devices 200 may include a volatile memory device such as a dynamic random-access memory (DRAM), a static RAM (SRAM), or a synchronous DRAM (SDRAM). In some exemplary embodiments, the semiconductor memory devices 200 may be DRAM-based volatile memory devices.

The SPD chip 180 may be a programmable read only memory (e.g., EEPROM). The SPD chip 180 may include initial information or device information DI of the memory module 100. In some exemplary embodiments, the SPD chip 180 may include the initial information or the device information DI such as a module form, a module configuration, a storage capacity, a module type, an execution environment, or the like for the memory module 100.

When the memory system 10 including the memory module 100 is booted up, the host device 20 may read the device information DI from the SPD chip 180 and may recognize the memory module 100 based on the device information DI. The host device 20 may control the memory module 100 based on the device information DI from the SPD chip 180. For example, the host device 20 may recognize a type of the semiconductor memory devices 200 included in the memory module 100 based on the device information DI from the SPD chip 180.

In some exemplary embodiments, the SPD chip 180 may communicate with the host device 20 through a serial bus. For example, the host device 20 may exchange a signal with the SPD chip 180 through the serial bus. The SPD chip 180 may also communicate with the control device 500 through the serial bus. The serial bus may include at least one of 2-line serial buses such as an inter-integrated circuit (I2C), a system management bus (SMBus), a power management bus (PMBus), an intelligent platform management interface (IPMI), a management component transport protocol (MCTP), or the like.

The PMIC 185 receives an input voltage VIN, generates a power supply voltage VDD based on the input voltage VIN, and provides the power supply voltage VDD to the semiconductor memory devices 200 and/or the control device 500. The semiconductor memory devices 200 operate based on the power supply voltage VDD.

When the memory system 10 including the memory module 100 is booted up, the semiconductor memory devices 200 or the control device 500 may generate a power-up signal that is activated when the level of the power supply voltage VDD provided to the PMIC 185 increases to a higher level than a reference level.

The memory module 100 may include a module temperature sensor TSOD. In some exemplary embodiments, as illustrated in FIG. 1, the module temperature sensor TSOD may be disposed in the SPD chip 180 that stores information on the memory module 100. In some exemplary embodiments, the module temperature sensor TSOD may be disposed on a proper position of the memory module 100 outside the SPD chip 180.

The plurality of semiconductor memory devices 100 may respectively include a plurality of temperature measurement circuits TMMS configured to measure a plurality of internal temperatures respectively corresponding to the plurality of semiconductor memory devices 100. As will be described below with reference to FIGS. 21 and 22, each temperature measurement circuit TMMS may measure an internal temperature of each semiconductor memory device and generate a temperature code TCODE corresponding to the internal temperature. The temperature measurement circuit TMMS may include an on-chip temperature sensor that is integrated in the same semiconductor die of the semiconductor memory device. Using the on-chip temperature sensor, the real internal temperature of the semiconductor memory device may be measured exactly and the thermal throttling of the memory system 10 may be performed efficiently by reflecting the exact internal temperature.

Referring to FIGS. 1 and 2, a module temperature may be measured using the module temperature sensor TSOD that is mounted on the memory module 100 (S100). The plurality of internal temperatures respectively corresponding to the plurality of semiconductor memory devices 200 may be measured using the plurality of temperature measurement circuits TMMS that are respectively included in the plurality of semiconductor memory devices 200 (S200).

The memory system 10 may generate a reference offset value based on the module temperature and the plurality of internal temperatures (S300). A thermal manager THC in the host device 20 may perform the thermal throttling of the memory module 100 based on the reference offset value and the module temperature (S400). The thermal manager THC may be implemented as software, hardware or a combination thereof. FIG. 1 illustrates a non-limiting example in which the thermal manager THC is included in the memory controller 25 but exemplary embodiments are not limited thereto. The thermal throttling by the thermal manager THC will be further described below with reference to FIG. 3.

Figure 3:
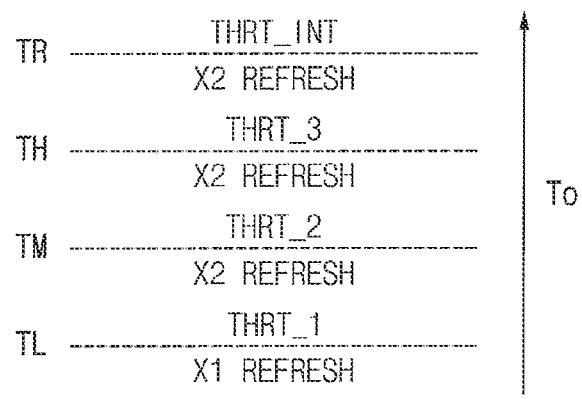
FIG. 3 is a diagram illustrating an exemplary embodiment of thermal throttling of a memory system according to such exemplary embodiments.

FIG. 3 is a diagram illustrating an exemplary embodiment of thermal throttling of a memory system according to such exemplary embodiments.

Referring to FIG. 3, a memory controller or a host device in a memory system may perform thermal throttling or temperature throttling based on several reference temperatures such as a low temperature TL, a middle temperature TM, a high temperature TH, and so on. A first temperature throttling level THRT_1, a second temperature throttling level THRT_2 and a third temperature throttling level THRT_3 may be applied for temperature ranges between the reference temperature TL, TM and TH. The semiconductor memory device may be controlled to lower the power consumption when the operational temperature To exceed the reference temperatures TL, TM and TH. The reduction of power consumption may be implemented by reducing an operational frequency of the semiconductor memory device and/or a bandwidth for transferring data between the semiconductor memory device and the memory controller. As the power consumption is lowered, the operational temperature To of the semiconductor memory device may be lowered.

The semiconductor memory device may perform a double speed (×2) refresh operation when the operational temperature To exceeds the low temperature TL, based on information from an internal sensor. Such control of the refresh operation is not for reducing power consumption of the semiconductor memory device but rather for preventing data loss stored in the memory cells.

In addition, the risk temperature TR, which is higher than the reference temperatures for the temperature throttling, may be set for preventing physical damage to the semiconductor memory device when the operational temperature To exceeds the risk temperature TR. For example, the risk temperature TR may be set to about 100° C. When the operational temperature To exceeds the risk temperature TR, the operation of the semiconductor memory device may be controlled to rapidly reduce power consumption of the semiconductor memory device, thereby reducing the operational temperature To.

However, the temperature throttling at the system level is performed based on information provided from an external temperature sensor such as the TSOD that cannot reflect the real operational temperature To of the semiconductor memory device.

Conventionally, to reflect the real temperature of the semiconductor memory device, the thermal throttling has been performed such that the operational temperature is corrected by applying offset values of the basic input and output system (BIOS) provided by a host device. In this case, such fixed offset values may not reflect the exact operational temperature that depends on thermal characteristics, such as memory capacity, cooling environments (e.g., airflow, interference) of a memory system. If the thermal throttling is performed based on inexact temperature information, the probability of physical damage to the semiconductor memory device may be increased.

In contrast, the reference offset value that is provided by comparing the module temperature and the internal temperatures of the semiconductor memory devices may reflect the real thermal environments. The operational temperature To for the thermal throttling may correspond to a sum of the module temperature and the reference offset value. In some exemplary embodiments, the reference offset value may correspond to the maximum internal temperature of the internal temperatures subtracted by the module temperature. In this case, the reference offset value may reflect the worst thermal environment and the safe operational environment may be implemented regardless of system dependency. Particularly, physical damage of the high-capacity memory module that is vulnerable to heat may be prevented efficiently.

As such, the memory module, the memory system and the method of operating a memory system according to exemplary embodiments may reduce physical damage to the semiconductor memory devices and enhance the performance and lifetime of the memory module and the memory system by dynamically generating the reference offset value based on the real internal temperatures of the semiconductor memory devices to perform thermal throttling based on the reference offset value.

Figure 4:
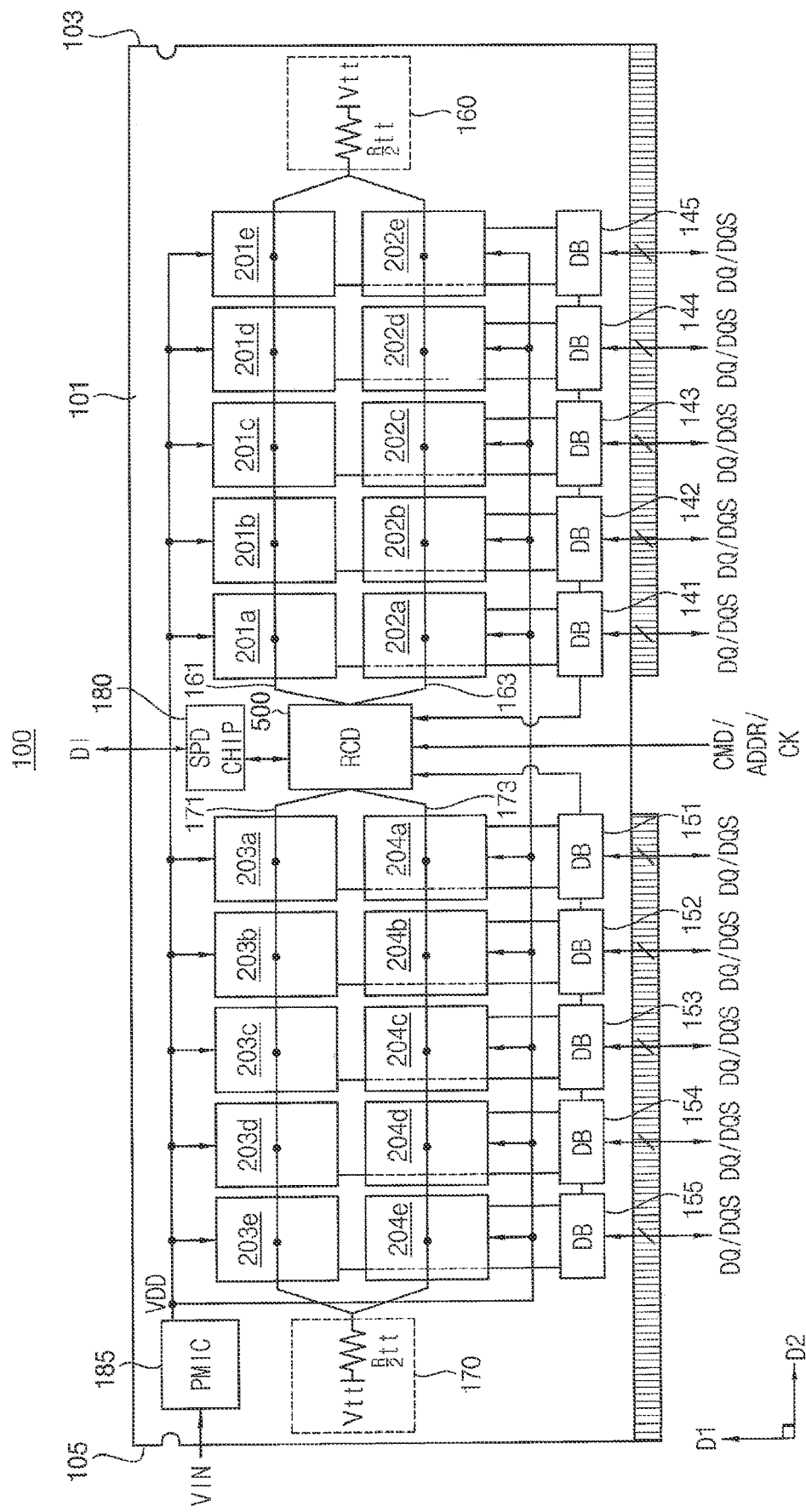
FIG. 4 is a diagram illustrating a memory module according to exemplary embodiments.

FIG. 4 is a diagram illustrating a memory module according to exemplary embodiments.

Referring to FIG. 4, a memory module 100 includes a control device 500 disposed (or mounted) in a circuit board 101, a plurality of semiconductor memory devices 201*a*~201*e*, 202*a*~202*e*, 203*a*~203*e*, and 204*a*~204*e*, a plurality of data buffers (DB) 141~145 and 151~155, module resistance units (MRU) 160 and 170, the SPD chip 180, and the PMIC 185.

Here, the circuit board 101, which is a printed circuit board, may extend in a second direction D2, perpendicular to a first direction D1, between a first edge portion 103 and a second edge portion 105. The first edge portion 103 and the second edge portion 105 may extend in the first direction D1.

The control device 500 may be disposed on a center of the circuit board 101. The plurality of semiconductor memory devices 201a~201e, 202a~202e, 203a~203e, and 204a~204e may be arranged in a plurality of rows between the control device 500 and the first edge portion 103 and between the control device 500 and the second edge portion 105.

The semiconductor memory devices 201a~201e and 202a~202e may be arranged along a plurality of rows between the control device 500 and the first edge portion 103. The semiconductor memory devices 203a~203e and 204a~204e may be arranged along a plurality of rows between the control device 500 and the second edge portion 105. A portion of the semiconductor memory devices 201a~201e and 202a~202e may be an error correction code (ECC) memory device. The ECC memory device may perform an ECC encoding operation to generate parity bits about data to be written at memory cells of the plurality of semiconductor memory devices 201a~201e, 202a~202e, 203a~203e, and 204a~204e, and an ECC decoding operation to correct an error occurring in the data read from the memory cells.

Each of the plurality of semiconductor memory devices 201a~201e, 202a~202e, 203a~203e, and 204a~204e may be coupled to a corresponding one of the data buffers (DB) 141~145 and 151~155 through a data transmission line for receiving/transmitting the data signal DQ and the data strobe signal DQS.

The control device 500 may provide a command/address signal (e.g., CA) to the semiconductor memory devices 201a~201e through a command/address transmission line 161 and may provide a command/address signal to the semiconductor memory devices 202a~202e through a command/address transmission line 163. In addition, the control device 500 may provide a command/address signal to the semiconductor memory devices 203a~203e through a command/address transmission line 171 and may provide a command/address signal to the semiconductor memory devices 204a~204e through a command/address transmission line 173.

The command/address transmission lines 161 and 163 may be connected in common to the module resistance unit (MRU) 160 disposed to be adjacent to the first edge portion 103, and the command/address transmission lines 171 and 173 may be connected in common to the module resistance unit (MRU) 170 disposed to be adjacent to the second edge portion 105. Each of the module resistance units (MRUs) 160 and 170 may include a termination resistor Rtt/2 connected to a termination voltage Vtt. In this case, the arrangement of the module resistance units (MRUs) 160 and 170 may reduce the number of the module resistance units, thus reducing an area where termination resistors are disposed.

In some exemplary embodiments, each of the plurality of semiconductor memory devices 201a~201e, 202a~202e, 203a~203e, and 204a~204e may be a DDR5 SDRAM.

The SPD chip 180 may be disposed to be adjacent to the control device 500, and the PMIC 185 may be disposed between the semiconductor memory device 203e and the second edge portion 105. The PMIC 185 may generate the power supply voltage VDD based on the input voltage VIN and may provide the power supply voltage VDD to the semiconductor memory devices 201a~201e, 202a~202e, 203a~203e, and 204a~204e.

Although FIG. 4 illustrates the PMIC 185 as being disposed to be adjacent to the second edge portion 105, exemplary embodiments are not limited thereto, and in some exemplary embodiments, the PMIC 185 may be disposed in a central portion of the circuit board 101 to be adjacent to the control device 500.

Exemplary embodiments of configuration and operations of the memory module associated with the dynamic thermal throttling according to such exemplary embodiments will be described in detail with reference to FIGS. 8 through 17.

Figure 5:
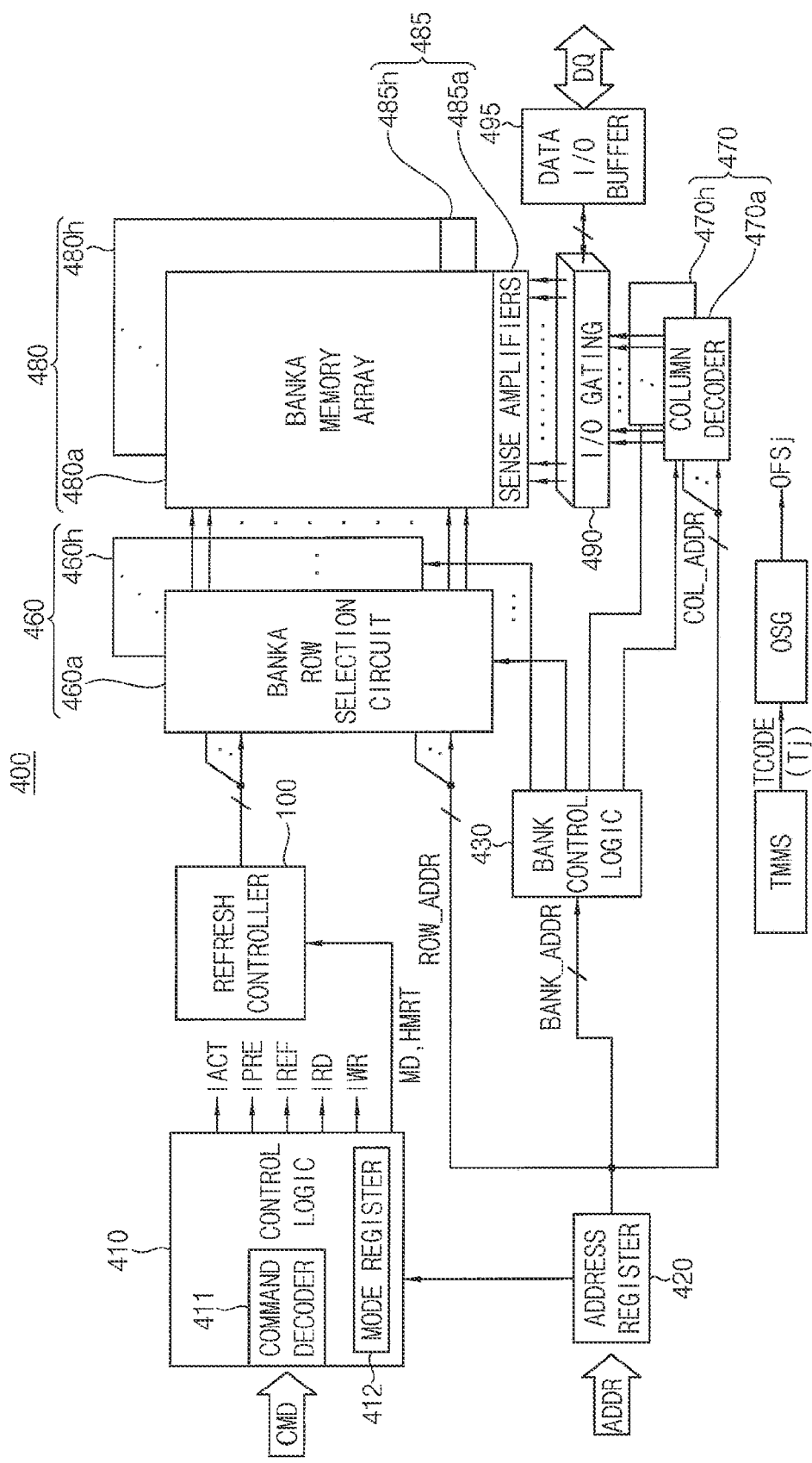
FIG. 5 is a block diagram illustrating a semiconductor memory device according to exemplary embodiments.

FIG. 5 is a block diagram illustrating a semiconductor memory device according to exemplary embodiments.

Referring to FIG. 5, a semiconductor memory device 400 may include a command control logic 410, an address register 420, a bank control logic 430, a row selection circuit 460 (or row decoder), a column decoder 470, a memory cell array 480, a sense amplifier unit 485, an input/output (I/O) gating circuit 490, a data input/output (I/O) buffer 495, refresh controller 100, a temperature measurement circuit TMMS and a chip offset generation circuit OSG. According to exemplary embodiments, the chip offset generation circuit OSG may be omitted according to some exemplary embodiments as will be described below.

The memory cell array 480 may include a plurality of bank arrays 480a~480h. The row selection circuit 460 may include a plurality of bank row selection circuits 460a~460h respectively coupled to the bank arrays 480a~480h. The column decoder 470 may include a plurality of bank column decoders 470a~470h respectively coupled to the bank arrays 480a~480h. The sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR, and a column address COL_ADDR from the memory controller 200. The address register 420 may provide the received bank address BANK_ADDR to the bank control logic 430, may provide the received row address ROW_ADDR to the row selection circuit 460, and may provide the received column address COL_ADDR to the column decoder 470.

The bank control logic 430 may generate bank control signals in response to the bank address BANK_ADDR. One of the bank row selection circuits 460a~460h corresponding to the bank address BANK_ADDR may be activated in response to the bank control signals, and one of the bank column decoders 470a~470h corresponding to the bank address BANK_ADDR may be activated in response to the bank control signals.

The row address ROW_ADDR from the address register 420 may be applied to the bank row selection circuits 460a~460h. The activated one of the bank row selection circuits 460a~460h may decode the row address ROW_ADDR, and may activate a wordline corresponding to the row address ROW_ADDR. For example, the activated bank row selection circuit 460 may apply a wordline driving voltage to the wordline corresponding to the row address ROW_ADDR.

The column decoder 470 may include a column address latch. The column address latch may receive the column address COL_ADDR from the address register 420, and may temporarily store the received column address COL_ADDR. In some exemplary embodiments, in a burst mode, the column address latch may generate column addresses that increment from the received column address COL_ADDR. The column address latch may apply the temporarily stored or generated column address to the bank column decoders 470a~470h.

The activated one of the bank column decoders 470a~470h may decode the column address COL_ADDR, and may control the I/O gating circuit 490 in order to output data corresponding to the column address COL_ADDR.

The I/O gating circuit 490 may include circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by one of the bank sense amplifiers 485a~485h coupled to the one bank array from which the data is to be read, and may be stored in the read data latches. The data stored in the read data latches may be provided to the memory controller 200 via the data I/O buffer 495. Data DQ to be written in one bank array of the bank arrays 480a~480h may be provided to the data I/O buffer 495 from the memory controller 200. The write driver may write the data DQ in one bank array of the bank arrays 480a~480h.

The command control logic 410 may control operations of the semiconductor memory device 400. For example, the command control logic 410 may generate control signals for the semiconductor memory device 400 in order to perform a write operation, a read operation, or a refresh operation. The command control logic 410 may generate internal command signals such as an active signal IACT, a precharge signal IPRE, a refresh signal IREF, a read signal IRD, a write signal IWR, etc., based on commands CMD transferred from the memory controller 200 in FIG. 3. The command control logic 410 may include a command decoder 411 that decodes the commands CMD received from the memory controller 200 and a mode register set 412 that sets an operation mode of the semiconductor memory device 400.

Although FIG. 5 illustrates the command control logic 410 and the address register 420 as being distinct from each other, the command control logic 410 and the address register 420 may be implemented as a single integrated circuit. In addition, although FIG. 5 illustrates the command CMD and the address ADDR as being provided as distinct signals, the command CMD and the address ADDR may be provided as a combined signal, e.g., as specified by DDR5, HBM and LPDDR5 standards.

The temperature measurement circuit TMMS included in each semiconductor memory device 400 may measure an internal temperature Tj of each semiconductor memory device 400 to generate a temperature code TCODE corresponding to each internal temperature Tj. The chip offset generation circuit OSG may generate a chip offset value corresponding to each internal temperature Tj subtracted by the module temperature. Exemplary embodiments of thermal throttling using the chip offset generation circuit OSG will be described below with reference to FIGS. 8 through 12.

Figure 6:
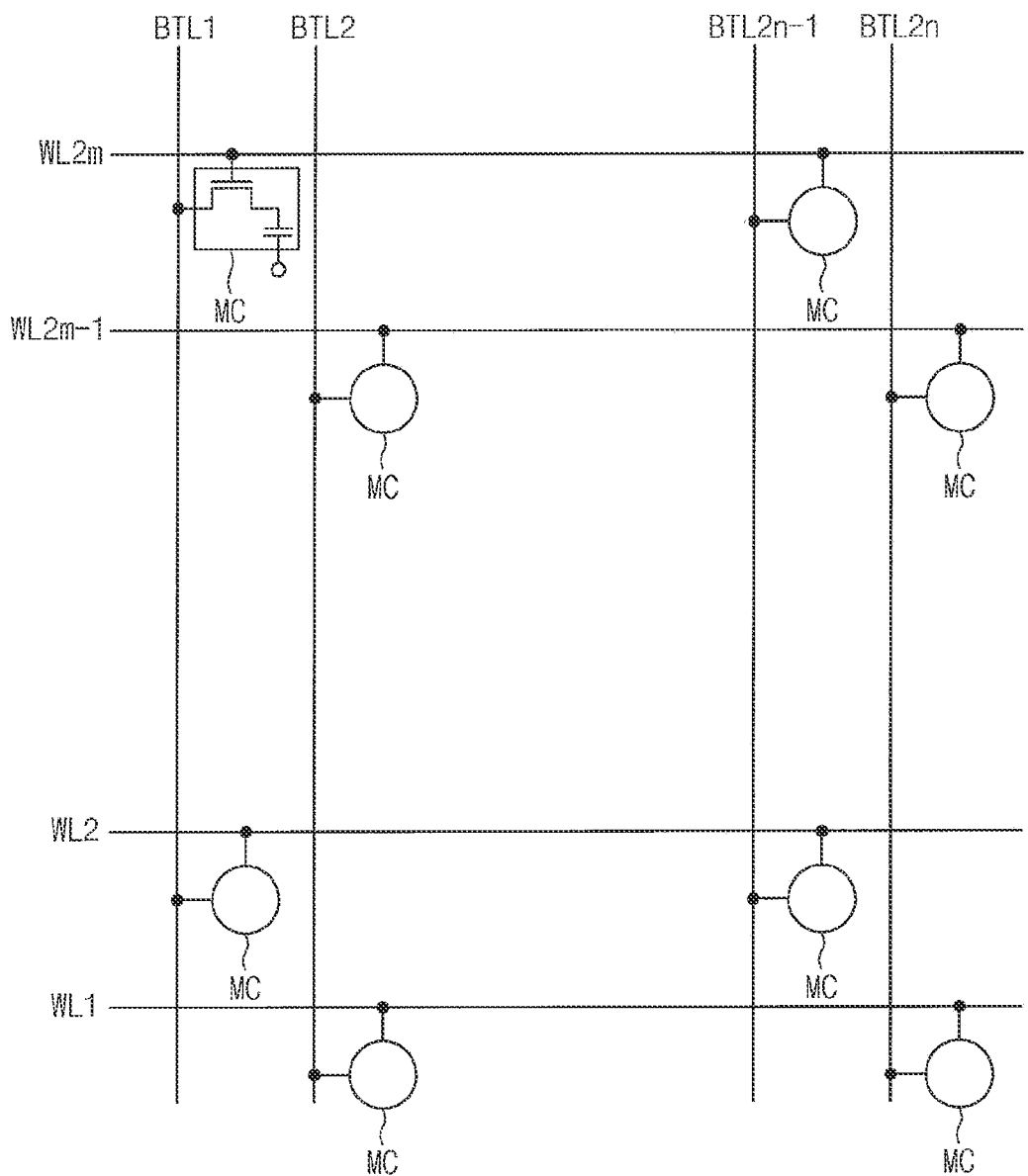
FIG. 6 is a diagram illustrating an exemplary embodiment of a bank array included in the semiconductor memory device of FIG. 5.

FIG. 6 is a diagram illustrating an exemplary embodiment of a bank array included in the semiconductor memory device of FIG. 5.

Referring to FIG. 6, a bank array 310 includes a plurality of word-lines WL1~WL2m (where m is a natural number greater than two), a plurality of bit-lines BTL1~BTL2n (where n is a natural number greater than two), and a plurality of memory cells MCs disposed near intersections between the word-lines WL1~WL2m and the bit-lines BTL1~BTL2n. In some exemplary embodiments, each of the plurality of memory cells MCs may include a DRAM cell structure as illustrated in FIG. 6. The plurality of word-lines WL1~WL2m to which the plurality of memory cells MCs are connected may be referred to as rows of the bank array 310 and the plurality of bit-lines BL1~BL3n to which the plurality of memory cells MCs are connected may be referred to as columns of the bank array 310.

Figure 7:
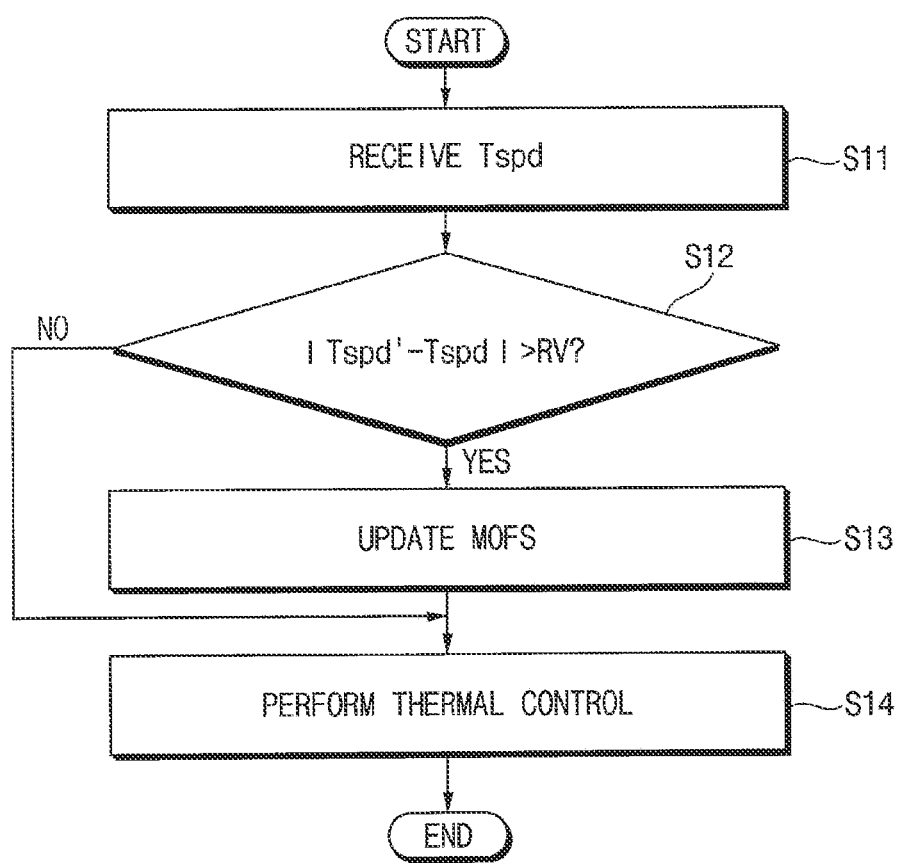
FIG. 7 is a flowchart illustrating a method of operating a memory system according to exemplary embodiments.

FIG. 7 is a flowchart illustrating a method of operating a memory system according to exemplary embodiments.

Referring to FIGS. 1 and 7, the memory controller 25 may receive the module temperature, that is, a present module temperature Tspd from the module temperature sensor TSOD (S11). In some exemplary embodiments, the memory controller 25 may periodically receive the module temperature from the module temperature sensor TSOD.

The memory controller 25 may compare a difference |Tspd'−Tspd| between the previous module temperature Tspd' and the present module temperature Tspd with a reference value RV (S12).

When the difference |Tspd'−Tspd| is greater than the reference value RV (S12: YES), the memory controller 25 may update the reference offset value MOFS (S13). Exemplary embodiments for updating the reference offset value MOFS will be described below. The thermal manager THC in the host device 20 may perform the thermal throttling as described with reference to FIG. 3 based on the present module temperature Tspd and the updated reference offset value MOFS (S14).

When the difference |Tspd'−Tspd| is not greater than the reference value RV (S12: NO), the memory controller 25 may not update the reference offset value MOFS and the thermal manager THC may perform the thermal throttling based on the reference offset value MOFS that is determined previously.

As such, the memory controller 25 may monitor the module temperature Tspd in realtime and determine whether to update the reference offset value MOFS based on the change of the module temperature Tspd.

Figure 8:
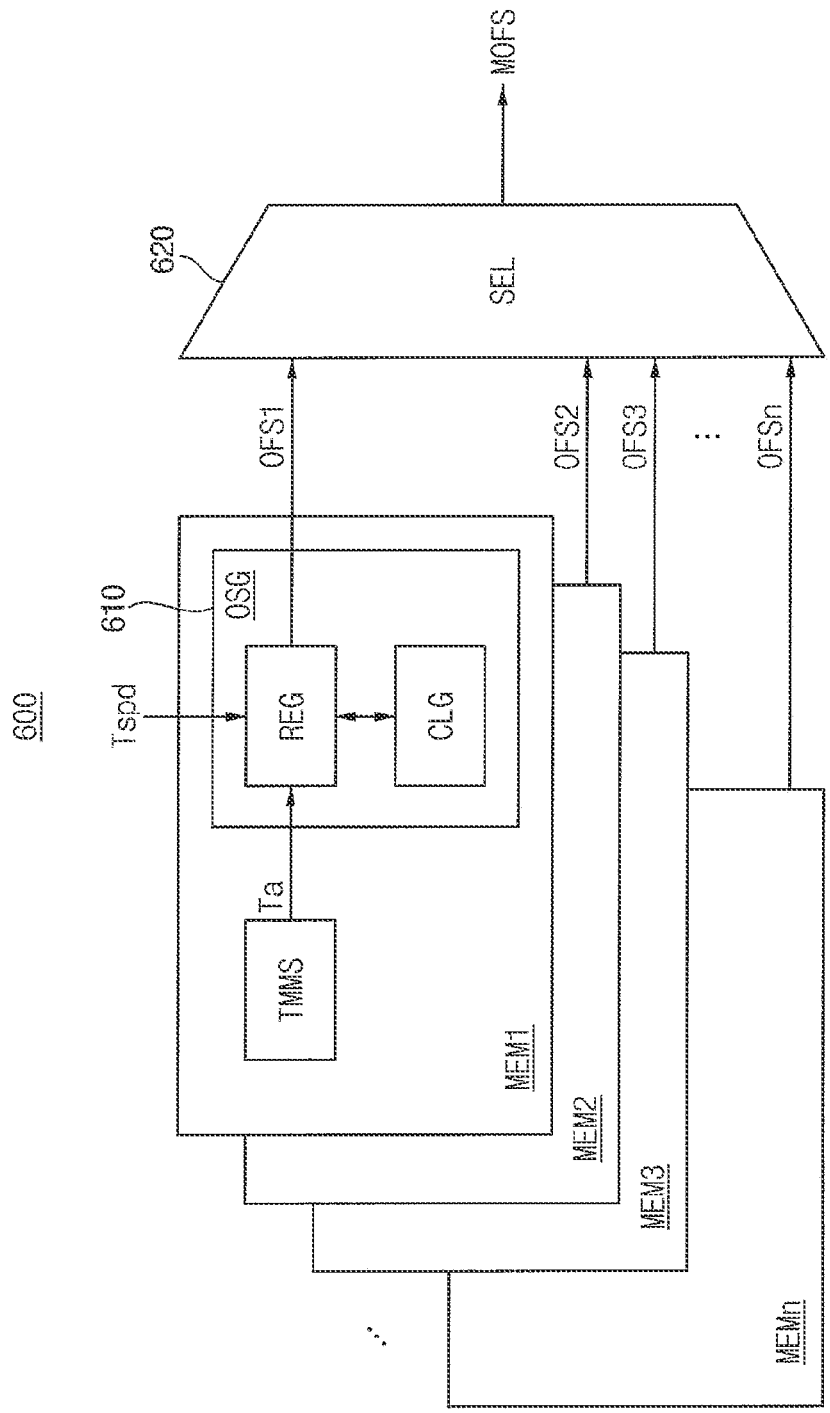
FIG. 8 is a diagram illustrating an exemplary embodiment of an offset circuit included in a memory system according to such exemplary embodiments.

FIG. 8 is a diagram illustrating an exemplary embodiment of an offset circuit included in a memory system according to such exemplary embodiments.

Referring to FIG. 8, an offset circuit 600 may include a temperature measurement circuit TMMS and a chip offset generation circuit OSG 610 that are included in each of a plurality of semiconductor memory devices, that is, first through n-th semiconductor memory devices MEM1~MEMn. The offset circuit 600 may further include a selector SEL 620. In some exemplary embodiments, the selector 620 may be included in the memory controller 25.

Each chip offset generation circuit 610 may include a register REG and a calculation logic circuit CLG. The register REG may store each internal temperature, the module temperature Tspd and each chip offset value. The calculation logic circuit CLG may subtract the module temperature Tspd from each internal temperature to output each chip offset value.

For example, the chip offset generation circuit 610 in the first semiconductor memory device MEM1 may generate the first chip offset value OFS1 corresponding to the first internal temperature Ta subtracted by the module temperature Tspd. As such, the chip offset generation circuits 610 respectively included in the plurality of semiconductor memory devices MEM1~MEMn may generate the plurality of chip offset values OFS1~OFSn respectively corresponding to the plurality of semiconductor memory devices MEM1~MEMn.

The selector 620 may receive the plurality of chip offset values OFS1~OFSn from the plurality of semiconductor memory devices MEM1~MEMn and select, as the reference offset value MOFS, the maximum chip offset value of the plurality of chip offset values OFS1~OFSn.

Figure 9:
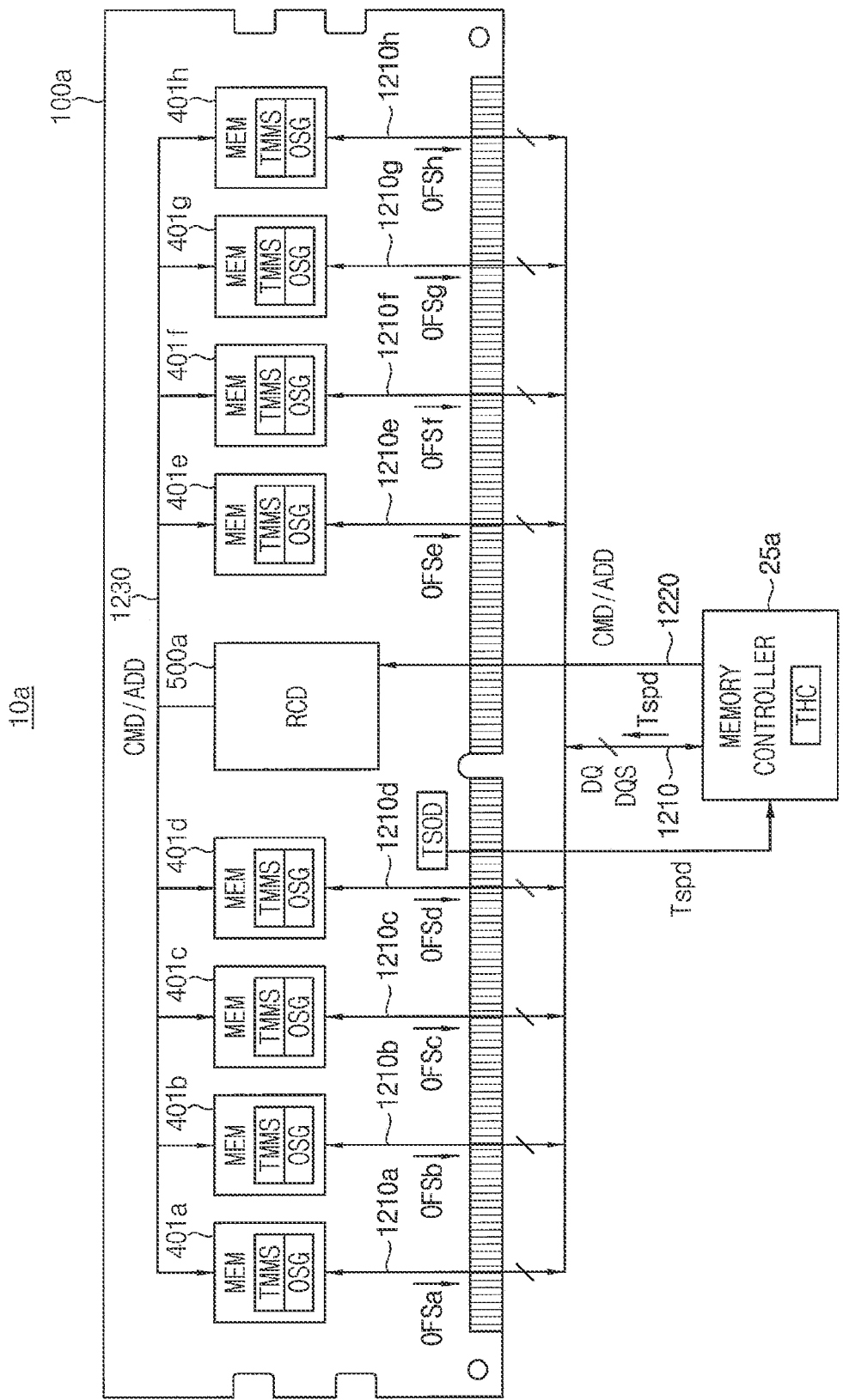
FIG. 9 is a diagram illustrating a memory system according to exemplary embodiments.
Figure 10:
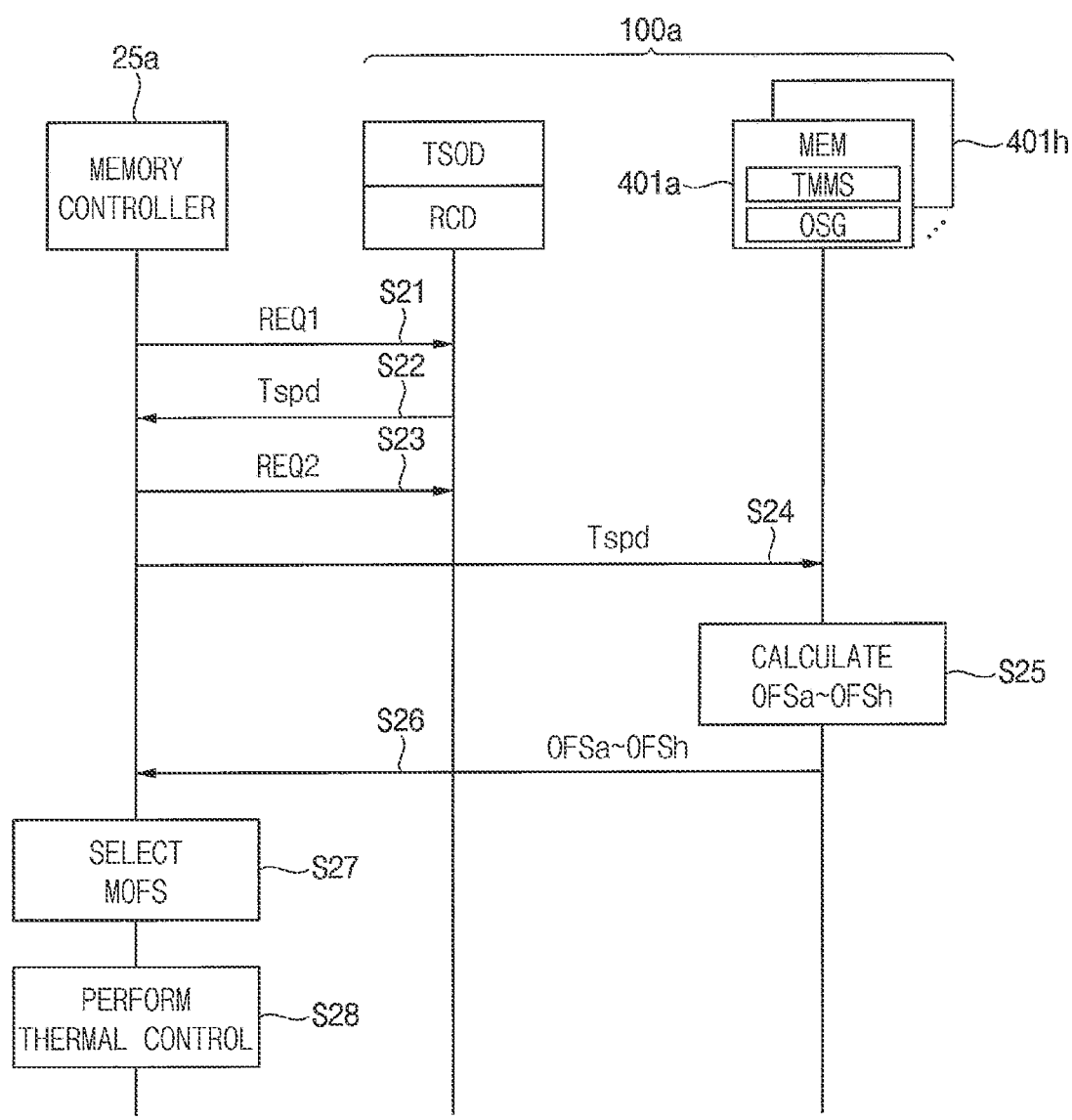
FIG. 10 is a diagram illustrating an operation sequence of the memory system of FIG. 9.

FIG. 9 is a diagram illustrating a memory system according to exemplary embodiments, and FIG. 10 is a diagram illustrating an operation sequence of the memory system of FIG. 9.

Referring to FIG. 9, a memory system 10*a* may include a memory module 100*a* and a memory controller 25*a*. The memory module 100*a* may include a module substrate, semiconductor memory device (or memory chips) 401*a*~401*h*, a control device RCD 500*a* and a module temperature sensor TSOD that are mounted on the module substrate. FIG. 9 illustrates eight semiconductor memory devices as an example, and the number of the semiconductor memory devices mounted on the module substrate may be determined variously. Hereinafter the repeated descriptions with FIG. 4 may be omitted as redundant.

The control device 500*a* may receive the command and address information CMD/ADD from the memory controller 25*a* via the control bus 1220, then buffers and re-drives the command and address information CMD/ADD. The command and address information CMD/ADD provided by the control device 500*a* may be communicated to the respective semiconductor memory devices 401*a*~401*h* via the first bus 1230.

Each of the semiconductor memory devices chips 401*a*~401*h* is connected to the memory controller 25*a* via a corresponding one of a plurality of data buses 1210*a*~1210*h*, whereby each semiconductor memory device is directly wired to the memory controller 25*a* for receipt and transfer of data signals DQ and data strobe signals DQS. Each of the semiconductor memory devices 401*a*~401*h* may receive the write data signal DQ and the data strobe signal DQS from the memory controller 25*a* via a corresponding one of the data buses 1210*a*~1210*h* respectively connected to the semiconductor memory devices 401*a*~401*h*, and the read data signal DQ and the data strobe signal DQS retrieved from each of the semiconductor memory devices 401*a*~401*h* may also be transferred to the memory controller 25*a* via the data buses 1210*a*~1210*h* and 1210.

As illustrated in FIG. 9, each of the semiconductor memory devices 401*a*~401*h* may include the temperature measurement circuit TMMS and the chip offset generation circuit OSG. The memory controller 25*a* may receive the module temperature Tspd from the module temperature sensor TSOD and transfer the module temperature Tspd to the semiconductor memory devices 401*a*~401*h*.

The memory controller 25*a* may receive the chip offset values OFSa~OFSh respectively from the semiconductor memory devices 401*a*~401*h*. As described above, the memory controller 25*a* may select the maximum chip offset value of the chip offset values OFSa~OFSh where the maximum chip offset value corresponds to the reference offset value MOFS. The thermal manager THC may perform the thermal throttling based on the reference offset value MOFS.

Referring to FIGS. 9 and 10, the memory controller 25*a* may transmit a first request REQ1 to request the transfer of the module temperature Tspd to the control device RCD (S21), and the module temperature Tspd may be transferred to the memory controller 25*a* under control of the control device RCD (S22).

After that, when the memory controller 25*a* may update the reference offset value MOFS as described with reference to FIG. 7, the memory controller 25*a* may transmit a second request REQ2 to request the transfer of the chip offset values OFSa~OFSh to the control device RCD (S23). In addition, the memory controller 25*a* may transfer the module temperature Tspd with the second request REQ2 to the semiconductor memory devices 401*a*~401*h* (S24).

The chip offset generation circuits OSG respectively included in the semiconductor memory devices 401*a*~401*h* may calculate the chip offset values OFSa~OFSh (S25) and transfer the chip offset values OFSa~OFSh to the memory controller 25*a* (S26).

The memory controller 25*a* may select, as the reference offset value MOFS, the maximum chip offset value of the chip offset values OFSa~OFSh (S27). The thermal manager THC of the memory controller 25*a* may perform the thermal throttling or thermal control based on the module temperature Tspd and the reference offset value MOFS (S28).

Figure 11:
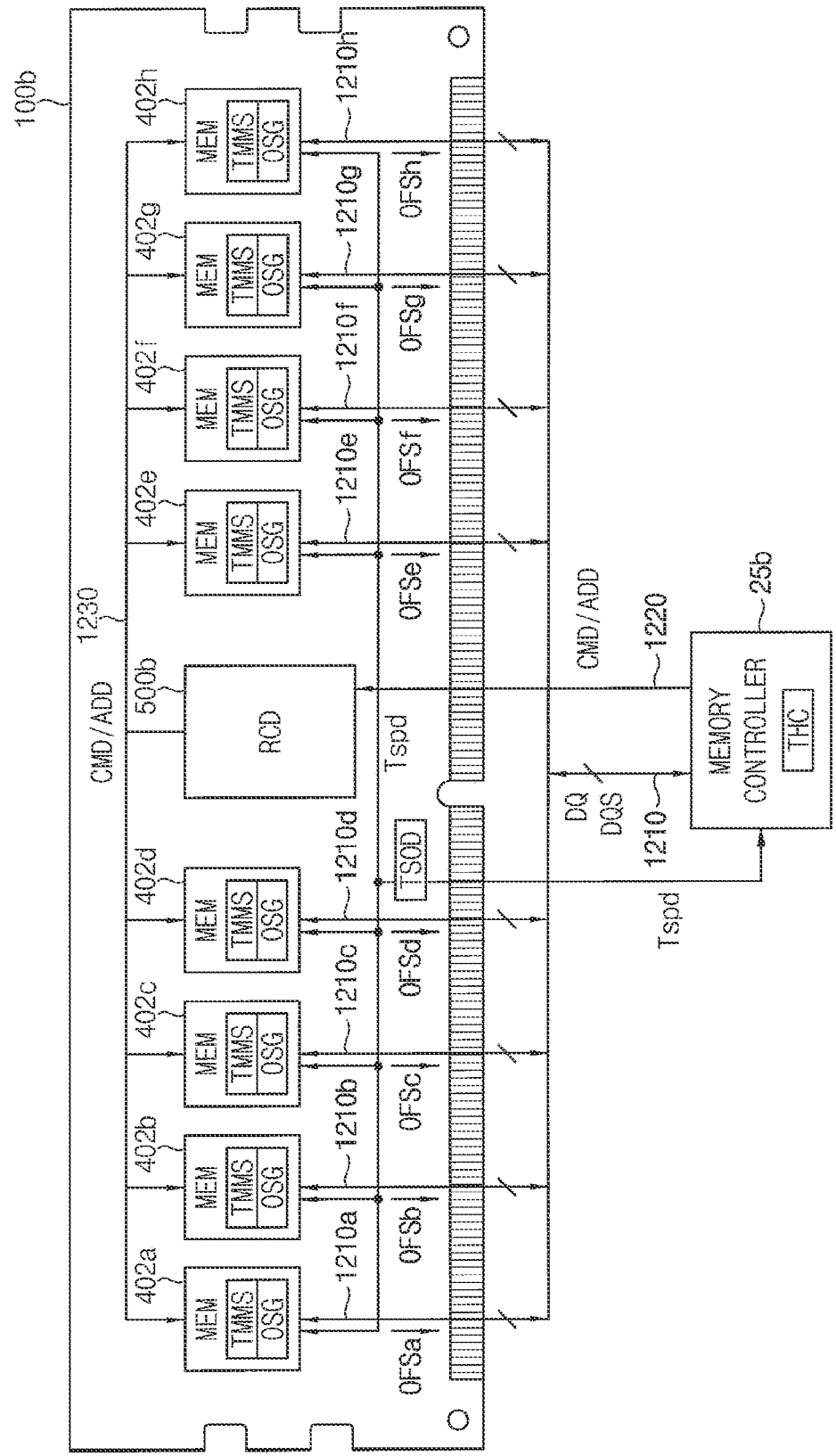
FIG. 11 is a diagram illustrating a memory system according to exemplary embodiments.
Figure 12:
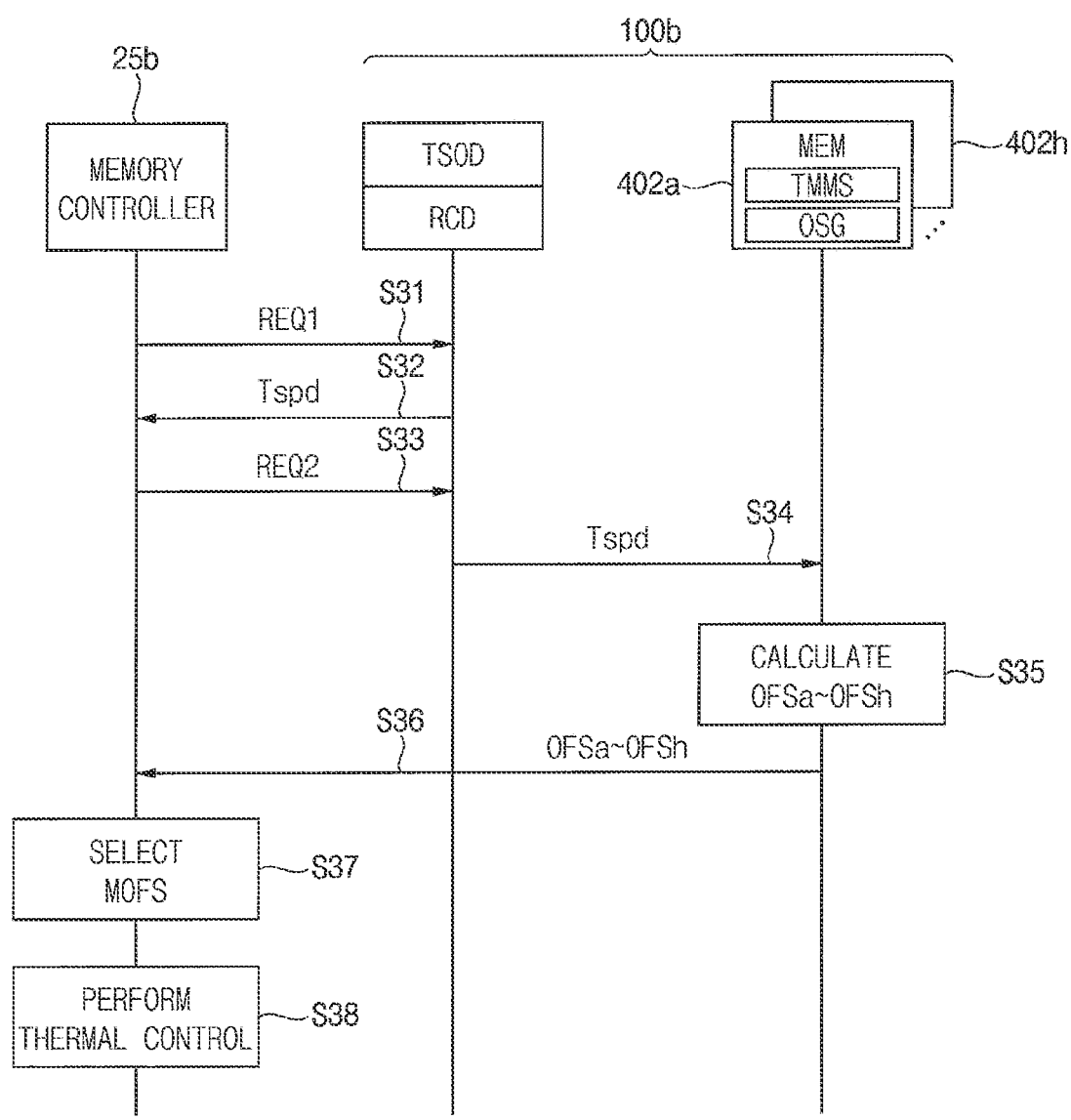
FIG. 12 is a diagram illustrating an operation sequence of the memory system of FIG. 11.

FIG. 11 is a diagram illustrating a memory system according to exemplary embodiments, and FIG. 12 is a diagram illustrating an operation sequence of the memory system of FIG. 11.

Referring to FIG. 11, a memory system 10*b* may include a memory module 100*b* and a memory controller 25*b*. The memory module 100*b* may include a module substrate, semiconductor memory device (or memory chips) 402*a*~402*h*, a control device RCD 500*b* and a module temperature sensor TSOD that are mounted on the module substrate. FIG. 11 shows eight semiconductor memory devices as an example, however the number of the semiconductor memory devices mounted on the module substrate may be determined variously. Hereinafter the repeated descriptions with FIG. 4 may be omitted as redundant.

The control device 500*b* may receive the command and address information CMD/ADD from the memory controller 25*b* via the control bus 1220, then buffers and re-drives the command and address information CMD/ADD. The command and address information CMD/ADD provided by the control device 500*b* may be communicated to the respective semiconductor memory devices 402*a*~402*h* via the first bus 1230.

Each of the semiconductor memory devices chips 402*a*~402*h* is connected to the memory controller 25*b* via a corresponding one of a plurality of data buses 1210*a*~1210*h*, whereby each semiconductor memory device is directly wired to the memory controller 25*b* for receipt and transfer of data signals DQ and data strobe signals DQS. Each of the semiconductor memory devices 402*a*~402*h* may receive the write data signal DQ and the data strobe signal DQS from the memory controller 25*b* via a corresponding one of the data buses 1210*a*~1210*h* respectively connected to the semiconductor memory devices 402*a*~402*h*, and the read data signal DQ and the data strobe signal DQS retrieved from each of the semiconductor memory devices 402*a*~402*h* may also be transferred to the memory controller 25*b* via the data buses 1210*a*~1210*h* and 1210.

As illustrated in FIG. 11, each of the semiconductor memory devices 402*a*~402*h* may include the temperature measurement circuit TMMS and the chip offset generation circuit OSG. The memory controller 25*b* may receive the module temperature Tspd from the module temperature sensor TSOD. In comparison with the exemplary embodiments of FIGS. 9 and 10, the module temperature Tspd may be transferred directly to the semiconductor memory devices 402a~402h through internal wirings without passing through the memory controller 25b.

The memory controller 25b may receive the chip offset values OFSa~OFSh respectively from the semiconductor memory devices 402a~402h. As described above, the memory controller 25b may select the maximum chip offset value of the chip offset values OFSa~OFSh where the maximum chip offset value corresponds to the reference offset value MOFS. The thermal manager THC may perform the thermal throttling based on the reference offset value MOFS.

Referring to FIGS. 11 and 12, the memory controller 25b may transmit a first request REQ1 to request the transfer of the module temperature Tspd to the control device RCD (S31), and the module temperature Tspd may be transferred to the memory controller 25b under control of the control device RCD (S32).

After that, when the memory controller 25b may update the reference offset value MOFS as described with reference to FIG. 7, the memory controller 25b may transmit a second request REQ2 to request the transfer of the chip offset values OFSa~OFSh to the control device RCD (S33). In this case, the module temperature Tspd may be provided directly to the semiconductor memory devices 402a~402h through internal wirings without passing through the memory controller 25b (S34).

The chip offset generation circuits OSG respectively included in the semiconductor memory devices 402a~402h may calculate the chip offset values OFSa~OFSh (S35) and transfer the chip offset values OFSa~OFSh to the memory controller 25b (S36).

The memory controller 25b may select, as the reference offset value MOFS, the maximum chip offset value of the chip offset values OFSa~OFSh (S37). The thermal manager THC of the memory controller 25b may perform the thermal throttling or thermal control based on the module temperature Tspd and the reference offset value MOFS (S38).

Figure 13:
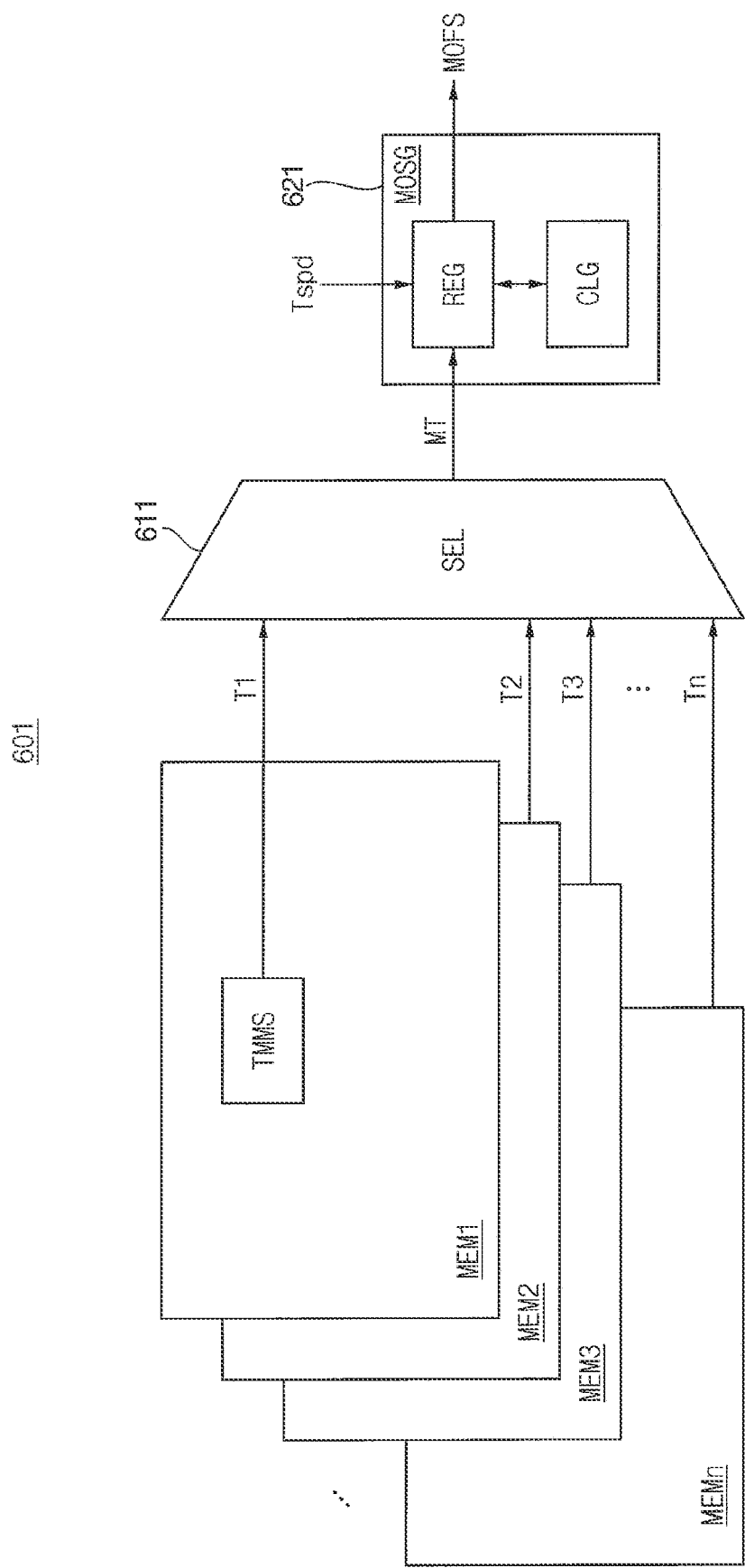
FIG. 13 is a diagram illustrating an exemplary embodiment of an offset circuit included in a memory system according to such exemplary embodiments.

FIG. 13 is a diagram illustrating an exemplary embodiment of an offset circuit included in a memory system according to such exemplary embodiments.

Referring to FIG. 13, an offset circuit 601 may include a temperature measurement circuit TMMS that is included in each of a plurality of semiconductor memory devices, that is, first through n-th semiconductor memory devices MEM1~MEMn. The offset circuit 601 may further include a selector SEL 611 and a reference offset generation circuit MOSG 621. In some exemplary embodiments, the selector 611 may be included in the reference offset generation circuit 621, and the reference offset generation circuit 621 including the selector 611 may be included in the control device of the memory module. In some exemplary embodiments, the reference offset generation circuit 621 including the selector 611 may be included in the memory controller.

The selector 611 may receive the first through n-th internal temperatures T1~Tn from the temperature measurement circuits TMMS respectively included in the first through n-th semiconductor memory devices MEM1~MEMn. The selector 611 may select and output a maximum internal temperature MT of the first through n-th internal temperatures T1~Tn.

The reference offset generation circuit 621 may generate the reference offset value MOFS by subtracting the module temperature Tspd from the maximum internal temperature MT.

Figure 14:
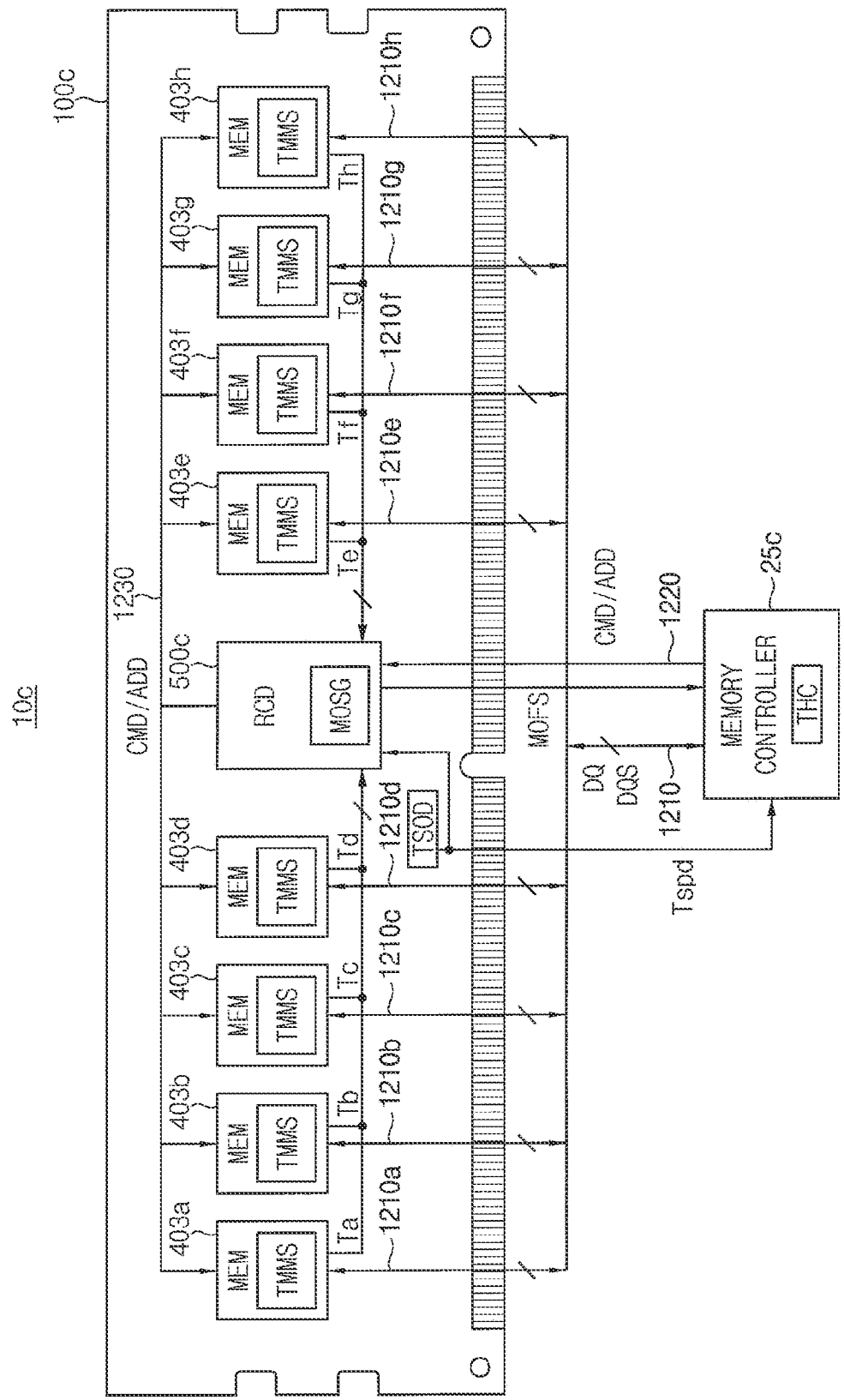
FIG. 14 is a diagram illustrating a memory system according to exemplary embodiments.
Figure 15:
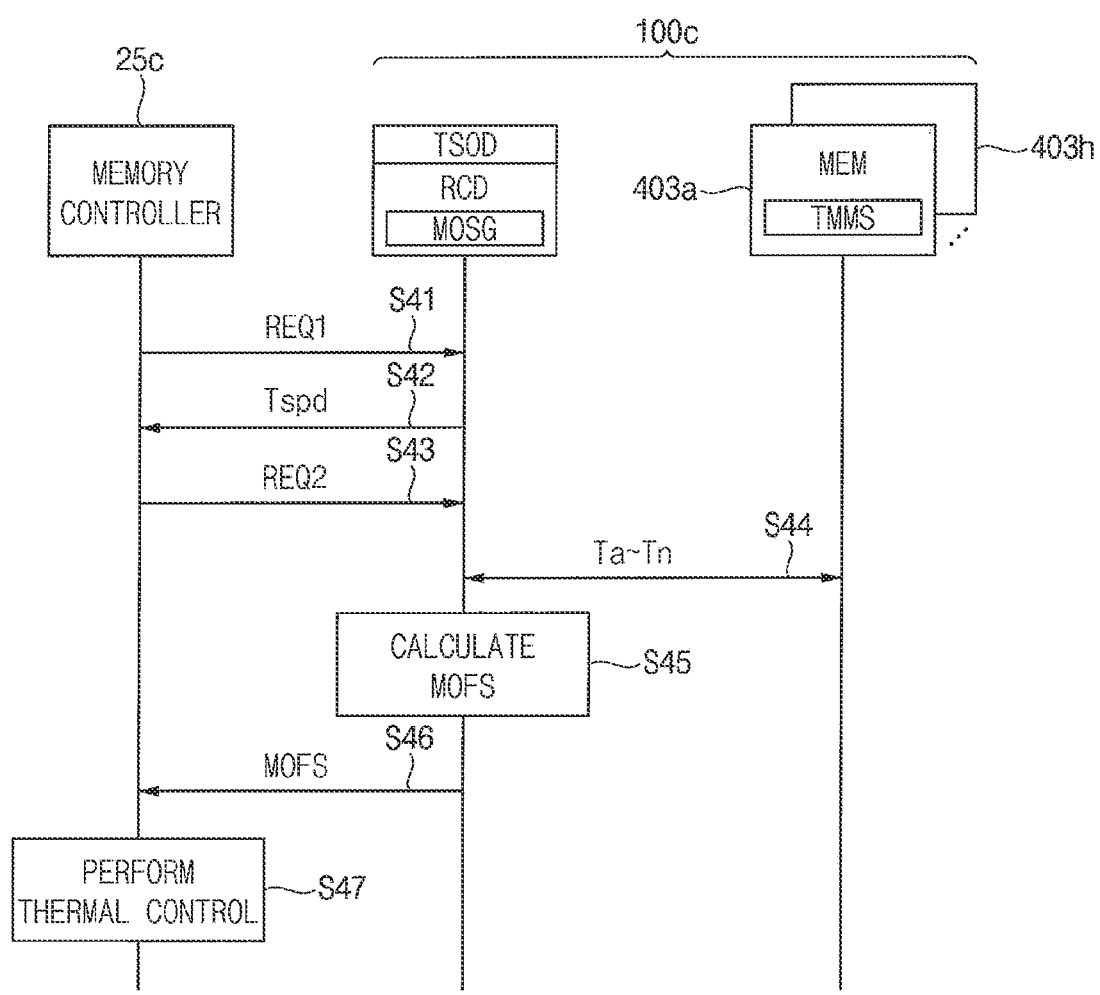
FIG. 15 is a diagram illustrating an operation sequence of the memory system of FIG. 14.

FIG. 14 is a diagram illustrating a memory system according to exemplary embodiments, and FIG. 15 is a diagram illustrating an operation sequence of the memory system of FIG. 14.

Referring to FIG. 14, a memory system 10c may include a memory module 100c and a memory controller 25c. The memory module 100c may include a module substrate, semiconductor memory device (or memory chips) 403a~403h, a control device RCD 500c and a module temperature sensor TSOD that are mounted on the module substrate. FIG. 14 shows eight semiconductor memory devices as an example, however the number of the semiconductor memory devices mounted on the module substrate may be determined variously. Hereinafter the repeated descriptions with FIG. 4 may be omitted as redundant.

The control device 500c may receive the command and address information CMD/ADD from the memory controller 25c via the control bus 1220, then buffers and re-drives the command and address information CMD/ADD. The command and address information CMD/ADD provided by the control device 500c may be communicated to the respective semiconductor memory devices 403a~403h via the first bus 1230.

Each of the semiconductor memory devices chips 403a~403h is connected to the memory controller 25c via a corresponding one of a plurality of data buses 1210a~1210h, whereby each semiconductor memory device is directly wired to the memory controller 25c for receipt and transfer of data signals DQ and data strobe signals DQS. Each of the semiconductor memory devices 403a~403h may receive the write data signal DQ and the data strobe signal DQS from the memory controller 25c via a corresponding one of the data buses 1210a~1210h respectively connected to the semiconductor memory devices 403a~403h, and the read data signal DQ and the data strobe signal DQS retrieved from each of the semiconductor memory devices 403a~403h may also be transferred to the memory controller 25c via the data buses 1210a~1210h and 1210.

As illustrated in FIG. 14, each of the semiconductor memory devices 403a~403h may include the temperature measurement circuit TMMS and the control device 500c may include the reference offset generation circuit MOSG. The control device 500c may receive the plurality of internal temperatures Ta~Th respectively from the semiconductor memory device 403a~403h and receive the module temperature Tspd from the module temperature sensor TSOD. In addition, the memory controller 25c may receive the module temperature Tspd from the module temperature sensor TSOD.

The reference offset generation circuit MOSG in the control device 500c may generate the reference offset value MOFS based on the internal temperatures Ta~Th and the module temperature Tspd, and transfer the reference offset value MOFS to the memory controller 25c. The memory controller 25c may perform the thermal throttling based on the reference offset value MOFS provided from the control device 500c.

Referring to FIGS. 14 and 15, the memory controller 25c may transmit a first request REQ1 to request the transfer of the module temperature Tspd to the control device RCD (S41), and the module temperature Tspd may be transferred to the memory controller 25c under control of the control device RCD (S42).

After that, when the memory controller 25c may update the reference offset value MOFS as described above with reference to FIG. 7, the memory controller 25c may transmit a second request REQ2 to request the transfer of the reference offset value MOFS to the control device RCD (S43). Under the control of the control device 500c, the semiconductor memory devices 403a~403h may transfer the internal temperatures Ta~Th to the control device 500c.

The reference offset generation circuit MOSG in the control device 500c may calculate the reference offset value MOFS as described with reference to FIG. 13 (S45), and transfer the reference offset value MOFS to the memory controller 25c (S46). The thermal manager THC of the memory controller 25c may perform the thermal throttling or thermal control based on the module temperature Tspd and the reference offset value MOFS (S47).

Figure 16:
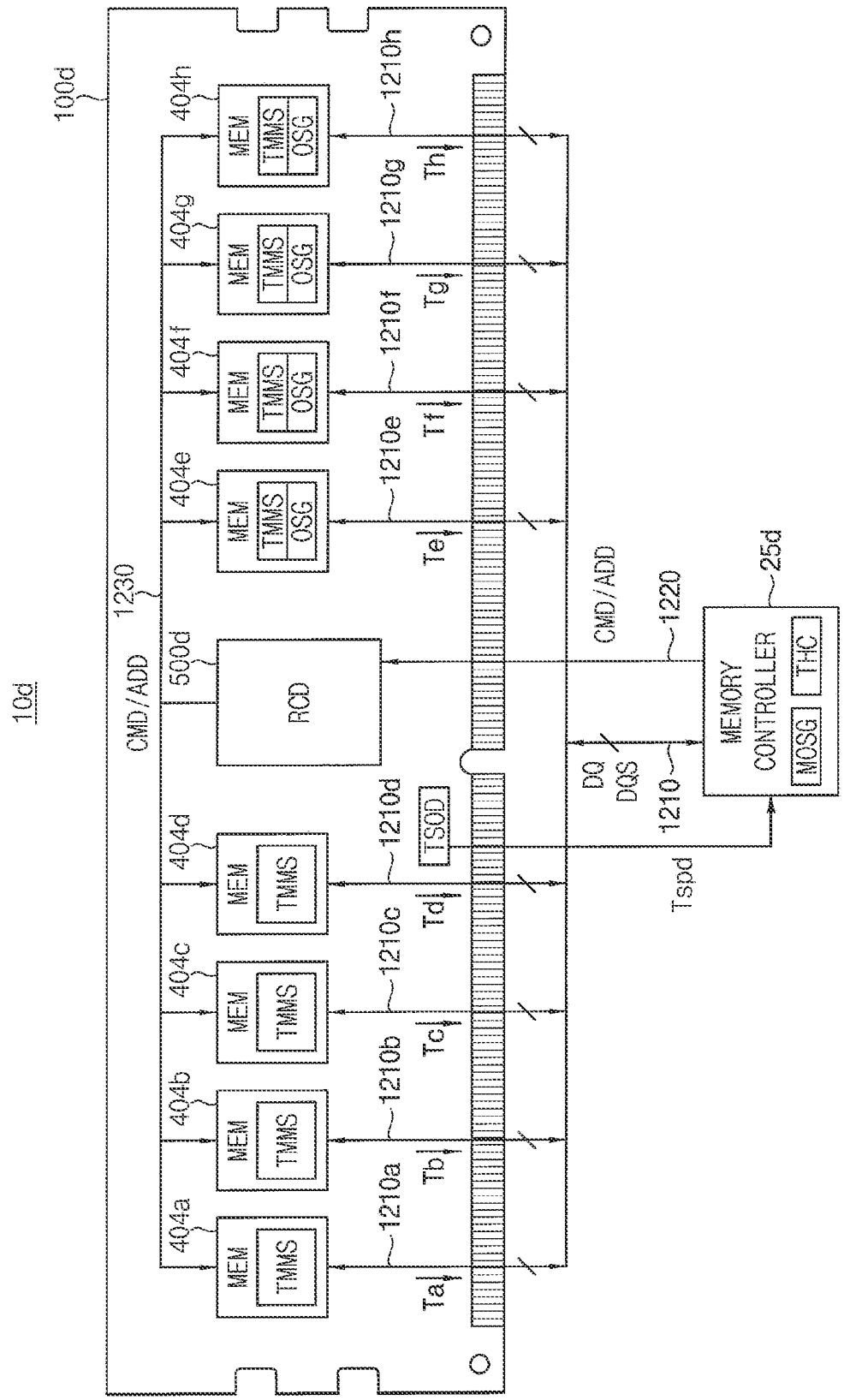
FIG. 16 is a diagram illustrating a memory system according to exemplary embodiments.
Figure 17:
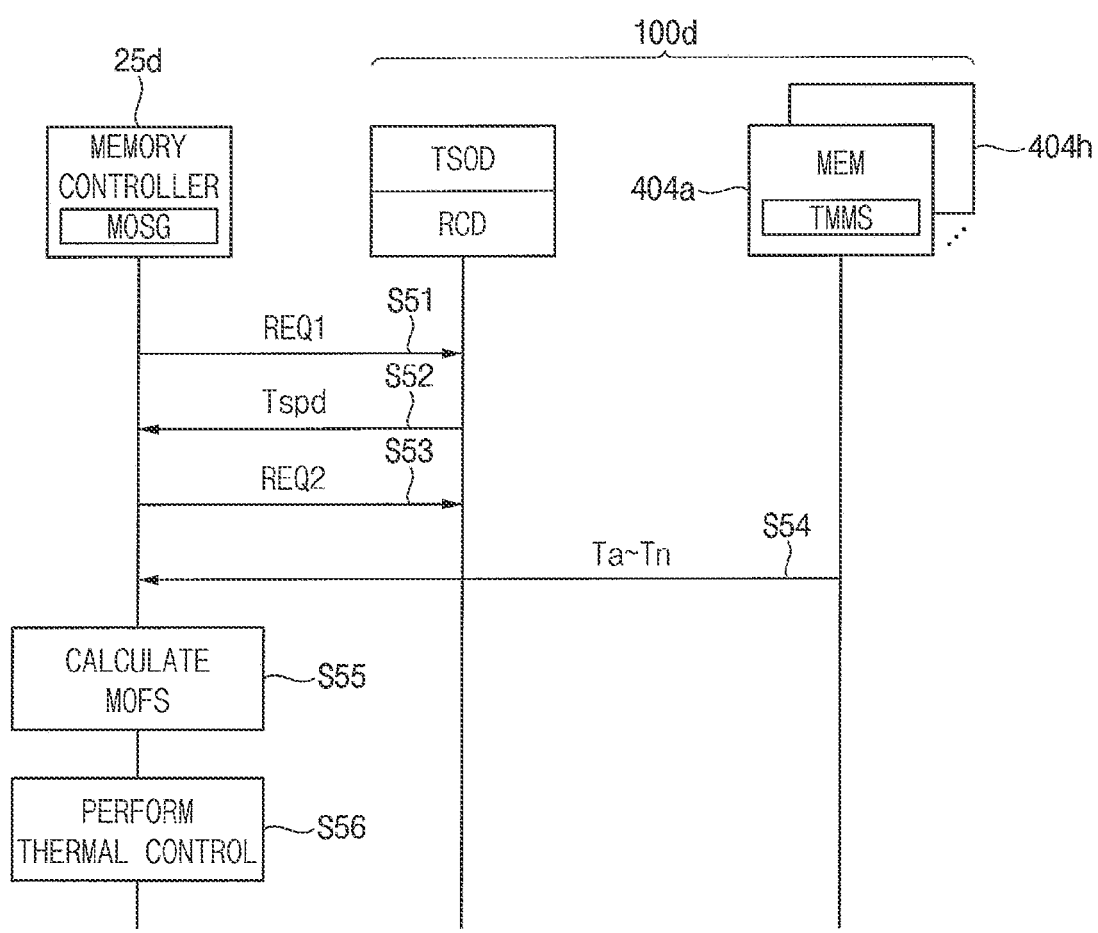
FIG. 17 is a diagram illustrating an operation sequence of the memory system of FIG. 16.

FIG. 16 is a diagram illustrating a memory system according to exemplary embodiments, and FIG. 17 is a diagram illustrating an operation sequence of the memory system of FIG. 16.

Referring to FIG. 16, a memory system 10d may include a memory module 100d and a memory controller 25d. The memory module 100d may include a module substrate, semiconductor memory device (or memory chips) 404a~404h, a control device RCD 500d and a module temperature sensor TSOD that are mounted on the module substrate. FIG. 16 shows eight semiconductor memory devices as an example, however the number of the semiconductor memory devices mounted on the module substrate may be determined variously. Hereinafter the repeated descriptions with FIG. 4 may be omitted as redundant.

The control device 500d may receive the command and address information CMD/ADD from the memory controller 25d via the control bus 1220, then buffers and re-drives the command and address information CMD/ADD. The command and address information CMD/ADD provided by the control device 500d may be communicated to the respective semiconductor memory devices 404a~404h via the first bus 1230.

Each of the semiconductor memory devices chips 404a~404h is connected to the memory controller 25d via a corresponding one of a plurality of data buses 1210a~1210h, whereby each semiconductor memory device is directly wired to the memory controller 25d for receipt and transfer of data signals DQ and data strobe signals DQS. Each of the semiconductor memory devices 404a~404h may receive the write data signal DQ and the data strobe signal DQS from the memory controller 25c via a corresponding one of the data buses 1210a~1210h respectively connected to the semiconductor memory devices 404a~404h, and the read data signal DQ and the data strobe signal DQS retrieved from each of the semiconductor memory devices 404a~404h may also be transferred to the memory controller 25d via the data buses 1210a~1210h and 1210.

As illustrated in FIG. 16, each of the semiconductor memory devices 404a~404h may include the temperature measurement circuit TMMS and the memory controller 25d may include the reference offset generation circuit MOSG. The memory controller 25d may receive the plurality of internal temperatures Ta~Th respectively from the semiconductor memory device 404a~404h and receive the module temperature Tspd from the module temperature sensor TSOD.

The reference offset generation circuit MOSG in the memory controller 25d may generate the reference offset value MOFS based on the internal temperatures Ta~Th and the module temperature Tspd, and the memory controller 25d may perform the thermal throttling based on the reference offset value MOFS generated in the memory controller 25d.

Referring to FIGS. 16 and 17, the memory controller 25d may transmit a first request REQ1 to request the transfer of the module temperature Tspd to the control device RCD (S51), and the module temperature Tspd may be transferred to the memory controller 25d under control of the control device RCD (S52).

After that, when the memory controller 25d may update the reference offset value MOFS as described above with reference to FIG. 7, the memory controller 25c may transmit a second request REQ2 to request the transfer of the internal temperatures Ta~Th to the control device RCD (S53). Under the control of the control device 500d, the semiconductor memory devices 404a~404h may transfer the internal temperatures Ta~Th to the memory controller 25d.

The reference offset generation circuit MOSG in the memory controller 25d may calculate the reference offset value MOFS as described with reference to FIG. 13 (S55), and perform the thermal throttling or thermal control based on the module temperature Tspd and the reference offset value MOFS (S56).

Figure 18:
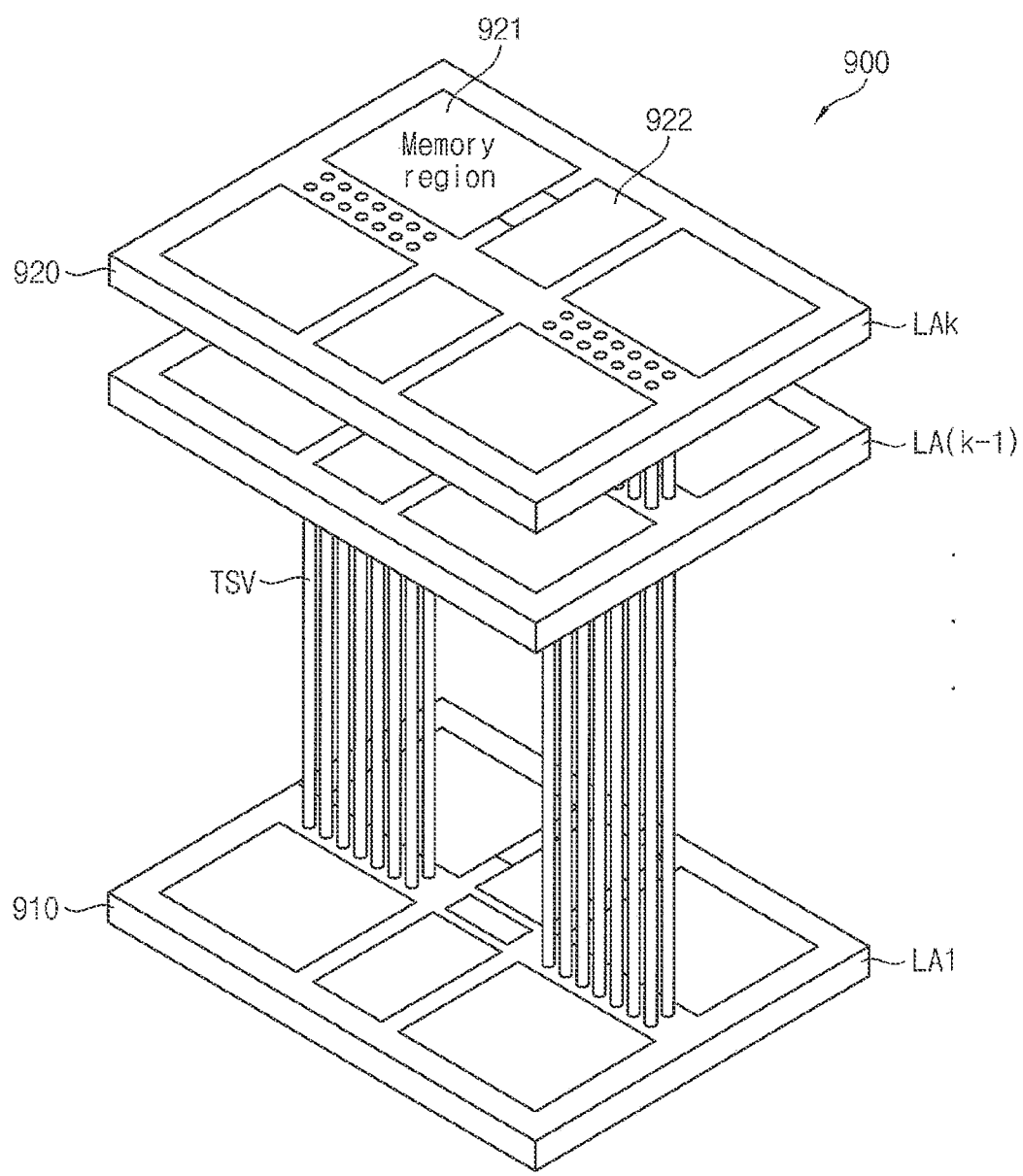
FIGS. 18 and 19 are diagrams illustrating a stacked memory device according to exemplary embodiments.
Figure 19:
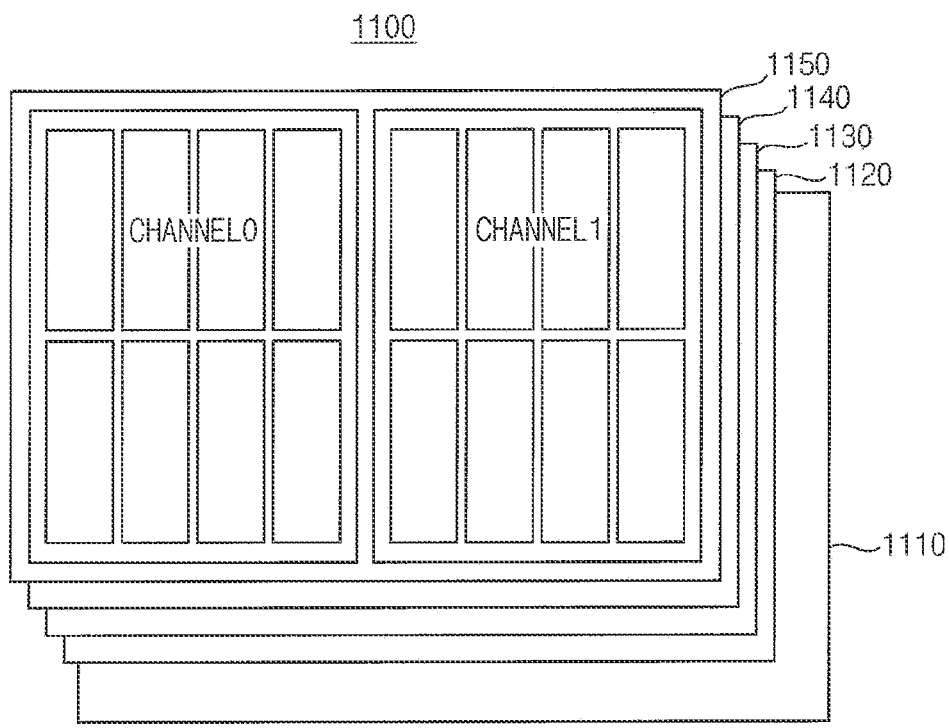

FIGS. 18 and 19 are diagrams illustrating a stacked memory device according to exemplary embodiments.

Referring to FIG. 18, a semiconductor memory device 900 may include first through kth semiconductor integrated circuit layers LA1 910 through LAk 920, in which the lowest, first semiconductor integrated circuit layer LA1 is assumed to be an interface or control chip, and the other semiconductor integrated circuit layers LA2 through LAk are assumed to be slave chips including core memory chips. The slave chips may form a plurality of memory ranks as described above.

The first through kth semiconductor integrated circuit layers LA1 through LAk may transmit and receive signals between the layers by through-substrate vias TSVs (e.g., through-silicon vias). The lowest first semiconductor integrated circuit layer LA1, as the interface or control chip, may communicate with an external memory controller through a conductive structure formed on an external surface.

Each of the first semiconductor integrated circuit layer LA1 910 through the kth semiconductor integrated circuit layer LAk 920 may include memory regions 921 and peripheral circuits 922 for driving the memory regions 921. For example, the peripheral circuits 922 may include a row-driver for driving wordlines of a memory, a column-driver for driving bit lines of the memory, a data input-output circuit for controlling input-output of data, a command buffer for receiving a command from an outside source and buffering the command, and an address buffer for receiving an address from an external source and buffering the address.

The first semiconductor integrated circuit layer LA1 910 may further include a control circuit. The control circuit may control access to the memory region 921 based on a command and an address signal from a memory controller and may generate control signals for accessing the memory region 921.

The first semiconductor integrated circuit layer LA1 910 may include a temperature measurement circuit and a chip offset generation circuit according to exemplary embodiments. As described above, the chip offset generation circuit may generate the chip offset value based on the internal temperature provided from the temperature measurement circuit and the module temperature provided from the module temperature sensor or the memory controller.

Figure 24:
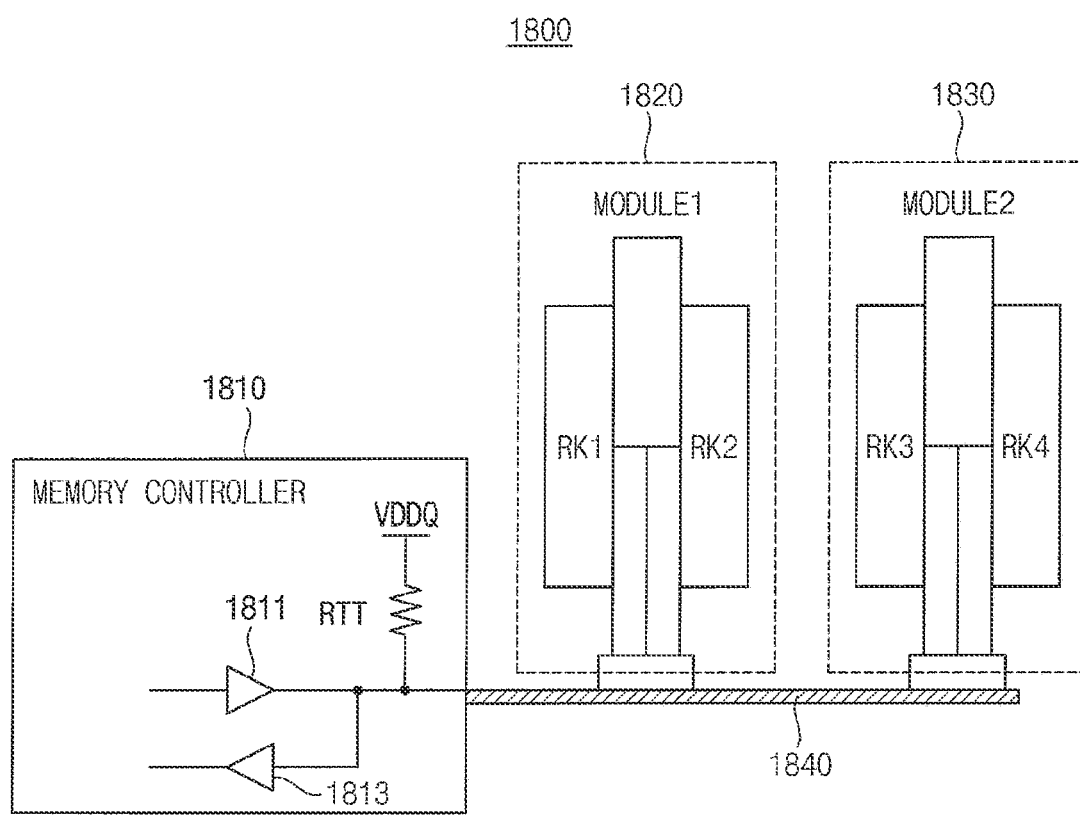
FIG. 24 is a diagram illustrating a memory system having quad-rank memory modules according to exemplary embodiments.

FIG. 19 illustrates an example of a high bandwidth memory (HBM) organization. Referring to FIG. 24, a HBM 1100 may have a stack of multiple DRAM semiconductor dies 1120, 1130, 1140, and 1150. The HBM of the stack structure may be optimized by a plurality of independent interfaces, i.e., channels. Each DRAM stack may support up to 8 channels in accordance with HBM standards. FIG. 19 shows an exemplary stack containing 4 DRAM semiconductor dies 1120, 1130, 1140, and 1150, with each DRAM semiconductor die supporting two channels CHANNEL0 and CHANNEL1.

Each channel provides access to an independent set of DRAM banks. Requests from one channel may not access data attached to a different channel Channels are independently clocked, and need not be synchronous.

The HBM 1100 may further include an interface die 1110 or a logic die at the bottom of the stack structure to provide signal routing and other functions. Some functions for the DRAM semiconductor dies 1120, 1130, 1140, and 1150 may be implemented in the interface die 1110.

In some exemplary embodiments, each of the DRAM semiconductor dies 1120, 1130, 1140, and 1150 may include the temperature measurement circuit and the chip offset generation circuit. In some exemplary embodiments, the temperature measurement circuit and the chip offset generation circuit that are common to the DRAM semiconductor dies 1120, 1130, 1140, and 1150 may be included in the interface die 1110.

Figure 20A:
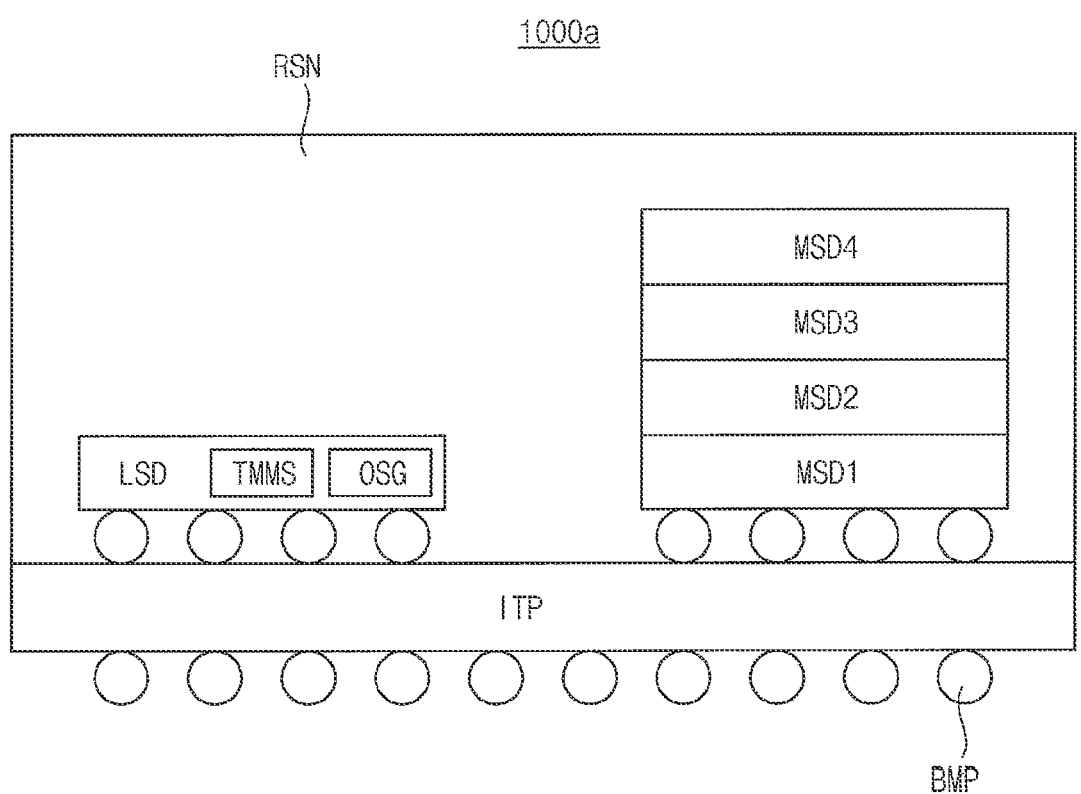
FIGS. 20a and 20b are diagrams illustrating packaging structures of a stacked memory device according to exemplary embodiments.
Figure 20B:
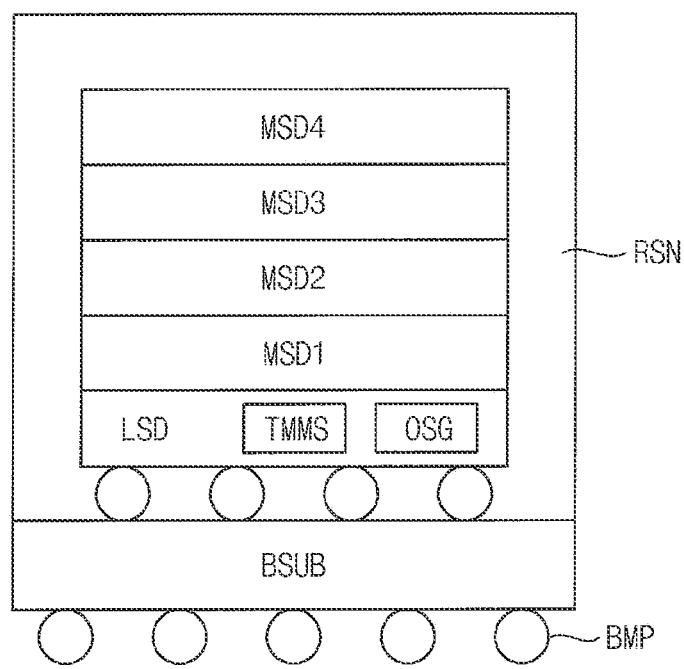

FIGS. 20a and 20b are diagrams illustrating packaging structures of a stacked memory device according to exemplary embodiments.

Referring to FIG. 20a, a memory device 1000a may be a memory package, and may include a base substrate or an interposer ITP and a stacked memory device stacked on the interposer ITP. The stacked memory device may include a logic semiconductor die LSD (or a buffer semiconductor die) and a plurality of memory semiconductor dies MSD1~MSD4.

Referring to FIG. 20b, a memory device 1000b may be a memory package and may include a base substrate BSUB and a stacked memory device stacked on the base substrate BSUB. The stacked memory device may include a logic semiconductor die LSD and a plurality of memory semiconductor dies MSD1~MSD4.

FIG. 20a illustrates a structure in which the memory semiconductor dies MSD1~MSD4 except for the logic semiconductor die LSD are stacked vertically and the logic semiconductor die LSD is electrically connected to the memory semiconductor dies MSD1~MSD4 through the interposer ITP or the base substrate. In contrast, FIG. 20b illustrates a structure in which the logic semiconductor die LSD is stacked vertically with the memory semiconductor dies MSD1~MSD4.

A temperature measurement circuit TMMS and a chip offset generation circuit OSG as described above may be included in the logic semiconductor die LSD. The chip offset generation circuit OSG may generate the chip offset value based on the internal temperature provided from the temperature measurement circuit TMMS and the module temperature provided from the module temperature sensor or the memory controller.

The base substrate BSUB may be the same as the interposer ITP or include the interposer ITP. The base substrate BSUB may be a printed circuit board (PCB). External connecting elements such as conductive bumps BMP may be formed on a lower surface of the base substrate BSUB and internal connecting elements such as conductive bumps may be formed on an upper surface of the base substrate BSUB. In some exemplary embodiments, the semiconductor dies LSD and MSD1~MSD4 may be electrically connected through through-silicon vias. In other exemplary embodiments, the semiconductor dies LSD and MSD1~MSD4 may be electrically connected through bonding wires. In still other exemplary embodiments, the semiconductor dies LSD and MSD1~MSD4 may be electrically connected through a combination of the through-silicon vias and the bonding wires. In the exemplary embodiment of FIG. 25, the logic semiconductor die LSD may be electrically connected to the memory semiconductor dies MSD1~MSD4 through conductive line patterns formed in the interposer ITP. The stacked semiconductor dies LSD and MSD1~MSD4 may be packaged using an encapsulant such as a resin RSN.

Figure 21:
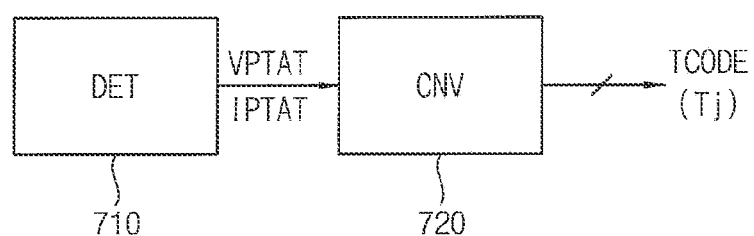
FIG. 21 is a block diagram illustrating an exemplary embodiment of a temperature measurement circuit included in a semiconductor memory device according to such exemplary embodiments.
Figure 22:
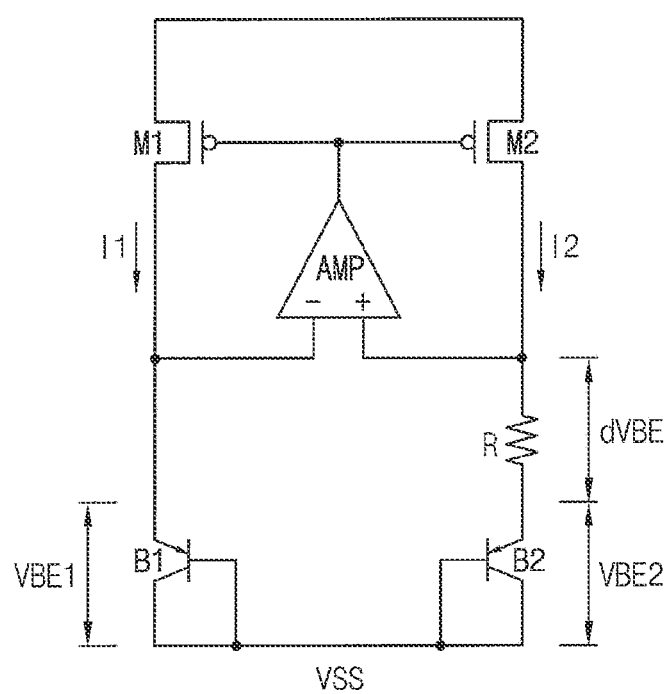
FIG. 22 is a circuit diagram illustrating an exemplary embodiment of a temperature detector included in the temperature measurement circuit of FIG. 21.

FIG. 21 is a block diagram illustrating an exemplary embodiment of a temperature measurement circuit included in a semiconductor memory device according to exemplary embodiments, and FIG. 22 is a circuit diagram illustrating an exemplary embodiment of a temperature detector included in the temperature measurement circuit of FIG. 21.

Referring to FIG. 21, a temperature measurement circuit 700 may include a temperature detector (DET) 710 and an analog-to-digital converter (CNV) 720. The temperature detector 710 may output at least one of a voltage signal VPTAT and a current signal IPTAT proportional to the operation temperature To. The analog-to-digital converter 720 may convert the output of the temperature detector 710 to a digital signal to generate a temperature code TCODE of multiple bits, where the temperature code may indicate each internal temperature Tj of each semiconductor memory device.

In some exemplary embodiments, the temperature detector 710 may be implemented with first and second PMOS transistors M1, M2, a feedback amplifier AMP, a resistor R and first and second bipolar transistors B1, B2, which are coupled between a power supply voltage VDD and a ground voltage VSS as illustrated in FIG. 22. A voltage dVBE across the resistor R may be obtained as Expression 1

$$dVBE = VBE1 - VBE2 = VT*\mathrm{Ln}(Ic1/Is1) - VT*\mathrm{Ln}(n*Ic2/Is2) = VT*\mathrm{Ln}(n) \quad \text{(Expression 1)}$$

In Expression 1, Is1 and Is2 indicate reverse saturation currents of the bipolar transistors B1, B2. Also, Ic1 and Ic2 indicate currents flowing through the bipolar transistors B1, B2. Additionally, n is a gain ratio of the bipolar transistors B1, B2, and VT indicates a temperature voltage that is proportional to an absolute temperature of the temperature detector 710. Ln(n) is a constant value and thus the voltage dVBE across the resistor R and the current I2 flowing through the resistor R are proportional to the temperature variation. The voltage signal VPTAT and the current signal IPTAT may be generated as an output based on the voltage dVBE and the current I2 proportional to the operational temperature.

The on-chip temperature sensor described with reference to FIGS. 21 and 22 may be integrated in the same semiconductor die of the semiconductor memory device, and the on-chip temperature sensor is distinct from an external temperature sensor such as the module temperature sensor TSOD that is disposed at the memory module. Using the temperature measurement circuit 700 as described with reference to FIGS. 21 and 22, the internal temperature Tj of the semiconductor memory device may be measured exactly.

Figure 23:
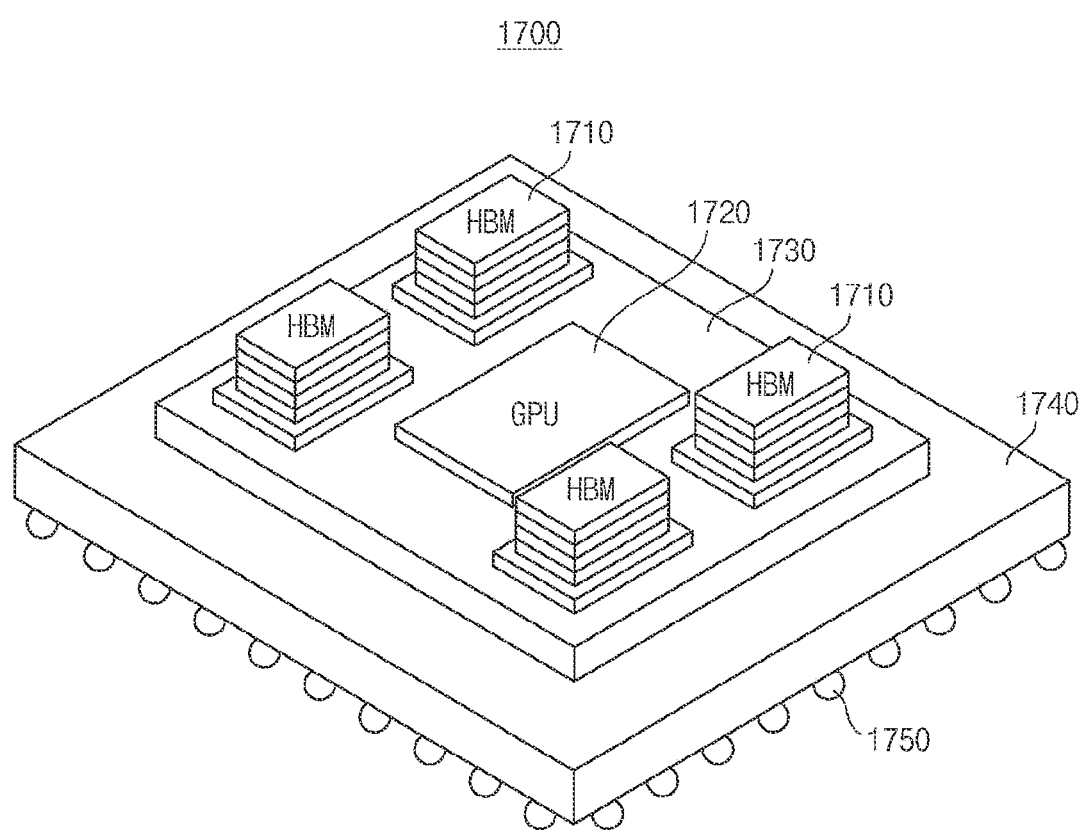
FIG. 23 is a diagram illustrating a semiconductor package including a stacked memory device according to exemplary embodiments.

FIG. 23 is a diagram illustrating a semiconductor package including a stacked memory device according to exemplary embodiments.

Referring to FIG. 23, a semiconductor package 1700 may include one or more stacked memory devices 1710 and a graphics processing unit (GPU) 1720.

The stacked memory devices 1710 and the GPU 1720 may be mounted on an interposer 1730, and the interposer on which the stacked memory device 1710 and the GPU 1720 are mounted may be mounted on a package substrate 1740. The package substrate 1740 is mounted on solder balls 1750. The GPU 1720 may perform the same operation as the memory controller 25 of FIG. 1 or may include the memory controller 25. The GPU 1720 may store data, which is generated or used in graphic processing in the stacked memory devices 1710.

The stacked memory device 1710 may be implemented in various forms, and the stacked memory device 1710 may be a memory device in a high bandwidth memory (HBM) form in which a plurality of layers are stacked. The stacked memory device 1710 may include a buffer die and a plurality of memory dies. The buffer die may include an interface circuit.

FIG. 24 is a diagram illustrating a memory system having quad-rank memory modules according to exemplary embodiments.

Referring to FIG. 24, a memory system 1800 may include a memory controller 1810 and one or more memory modules 1820 and 1830. Two memory modules 1820 and 830 are illustrated in FIG. 24, but this is only an example.

The memory controller 1810 may control the one or more memory modules 1820 and 1830 so as to perform a command supplied from a processor or host. The memory controller 1810 may be implemented in a processor or host, or may be implemented with an application processor or a system-on-a-chip (SoC). For signal integrity, a source termination may be implemented with a resistor RTT on a bus 1840 of the memory controller 1810. The resistor RTT may be coupled to a power supply voltage VDDQ. The memory controller 1810 may include a transmitter 1811 to transmit a signal to the one or more memory modules 1820 and 1830 and a receiver 1813 to receive a signal from the one or more memory modules 1820 and 1830.

The one or more memory modules 1820 and 1830 may be referred to as a first memory module 1820 and a second memory module 1830. The first memory module 1820 and the second memory module 1830 may be coupled to the memory controller 1810 through the bus 1840. Each of the first memory module 1820 and the second memory modules 1830 may correspond to the memory module 100a of FIG. 9, the memory module 100b of FIG. 11, the memory module 100c of FIG. 14 or the memory module 100d of FIG. 16. The first memory module 1820 may include one or more memory ranks RK1 and RK2, and the second memory module 1830 may include one or more memory ranks RK3 and RK4.

Each of the first memory module 1820 and the second memory module 1830 may include a control device disposed at the center of a circuit board, a first group of semiconductor memory devices disposed between the control device and a first edge portion of the circuit board and a second group of semiconductor memory devices disposed between the control device and a second edge portion of the circuit board.

Figure 25:
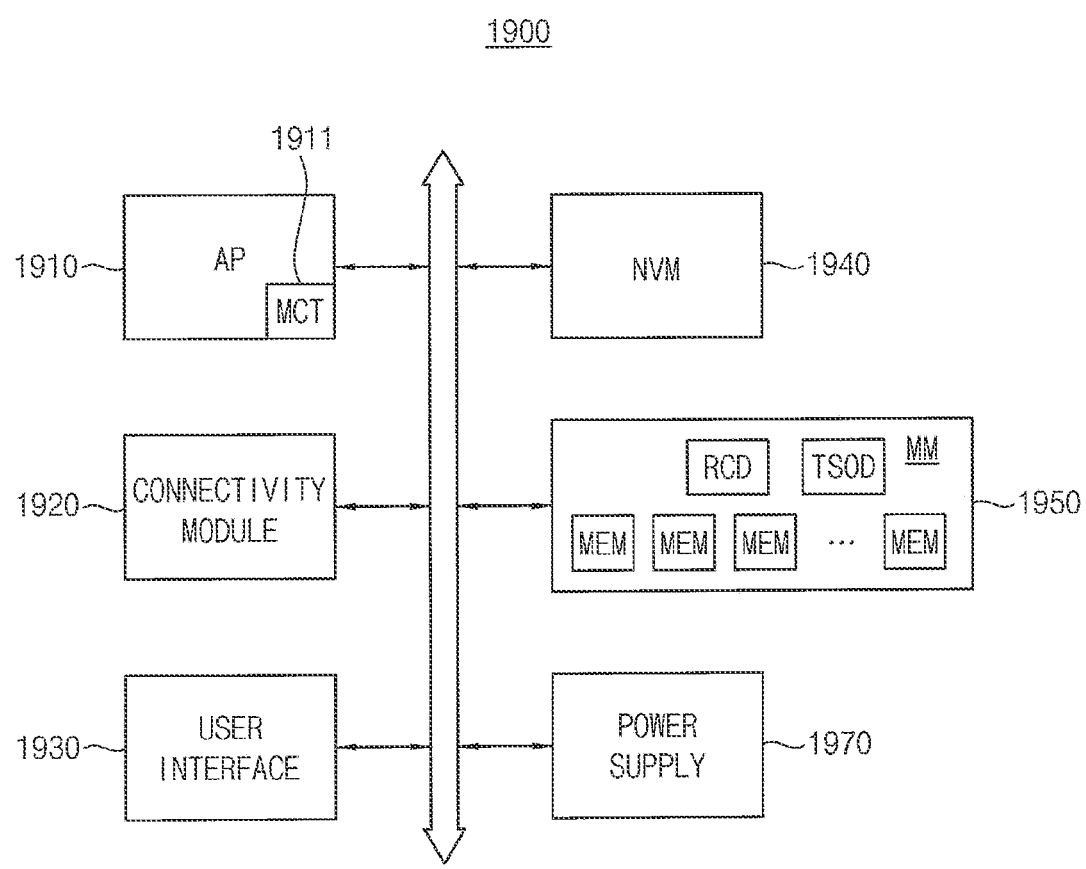
FIG. 25 is a block diagram illustrating a mobile system including a memory module according to exemplary embodiments.

FIG. 25 is a block diagram illustrating a mobile system including a memory module according to exemplary embodiments.

Referring to FIG. 25, a mobile system 1900 may include an application processor (AP) 1910, a connectivity module 1920, a memory module (MM) 1950, a nonvolatile memory device (NVM) 1940, a user interface 1930, and a power supply 1970. The application processor 1910 may include a memory controller (MCT) 1911.

The application processor 1910 may execute applications, such as a web browser, a game application, a video player, etc. The connectivity module 1920 may perform wired or wireless communication with an external device.

The memory module 1950 may store data processed by the application processor 1910 or operate as a working memory. The memory module 1950 may include a plurality of semiconductor memory devices MEM, a control device RCD and a module temperature sensor TSOD. Each of the semiconductor memory devices MEM may include a temperature measurement circuit as described above. In some exemplary embodiments, a chip offset generation circuit as described above may be further included in each of the semiconductor memory devices MEM. In some exemplary embodiments, the reference offset generation circuit as described above may be included in the control device RCD or the memory controller 1911.

As will be appreciated by one skilled in the art, embodiments of the present invention may be realized as a system, method, computer program product, or a computer program product embodied in one or more computer readable medium(s) having computer readable program code embodied thereon. The computer readable program code may be provided to a processor of a general purpose computer, special purpose computer, or other programmable data processing devices. The computer readable medium may be a computer readable signal medium or a computer readable storage medium. The computer readable storage medium may be any tangible medium that can contain, or store a program for use by or in connection with an instruction execution system, apparatus, or device.

As described above, the memory module, the memory system and the method of operating a memory system according to the exemplary embodiments may reduce physical damage to the semiconductor memory devices and enhance the performance and lifetime of the memory module and the memory system by dynamically generating the reference offset value based on the real internal temperatures of the semiconductor memory devices to perform the thermal throttling based on the reference offset value.

The inventive concept may be applied to any electronic devices and systems. For example, the inventive concept may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable electronic device, an internet of things (IoT) device, an internet of everything (IoE) device, an e-book, a virtual reality (VR) device, an augmented reality (AR) device, a server system, a stand-alone server/personal computer, a high-capacity memory server, a data center, a supercomputer, a high-performance computing device, an automotive device, etc.

The foregoing is illustrative of exemplary embodiments and is not to be construed as limiting thereof. Although a few exemplary embodiments have been described, those skilled in the art will readily appreciate that many variations and modifications are possible in the exemplary embodiments without materially departing from the present inventive concept as defined by the appended claims.

What is claimed is:

1. A memory system comprising:
a memory module including
a control device,
a module temperature sensor configured to measure a module temperature, and
a plurality of semiconductor memory devices configured to store data, the plurality of semiconductor memory devices respectively including a plurality of temperature measurement circuits configured to measure a plurality of internal temperatures, wherein the plurality of internal temperatures are respective internal temperatures of the plurality of semiconductor memory devices; and
a memory controller configured to control the memory module,
wherein the memory system is configured to generate a reference offset value based on the module temperature and the plurality of internal temperatures and perform thermal throttling of the memory module based on the reference offset value and the module temperature, and
wherein the reference offset value corresponds to a maximum internal temperature of the plurality of internal temperatures subtracted by the module temperature.

2. The memory system of claim 1, wherein each semiconductor memory device of the plurality of semiconductor memory devices further includes a chip offset generation circuit configured to generate, as a plurality of chip offset values, a chip offset value corresponding to each internal temperature of the plurality of internal temperatures subtracted by the module temperature.

3. The memory system of claim 2, wherein the chip offset generation circuit includes:
a register configured to store the plurality of internal temperatures, the module temperature, and the plurality of chip offset values; and
a calculation logic circuit configured to subtract the module temperature from each internal temperature to output each chip offset value.

4. The memory system of claim 2, wherein the memory controller is configured to receive the module temperature from the memory module and transfer the module temperature to the plurality of semiconductor memory devices.

5. The memory system of claim 2, wherein the module temperature is transferred directly to the plurality of semiconductor memory devices and bypasses the memory controller.

6. The memory system of claim 2, wherein the memory controller is configured to receive the plurality of chip offset values.

7. The memory system of claim 6, wherein the memory controller is configured to select, as the reference offset value, a maximum chip offset value of the plurality of chip offset values.

8. The memory system of claim 1, wherein the control device includes:
a selector configured to select and output the maximum internal temperature of the plurality of internal temperatures; and
a reference offset generation circuit configured to generate the reference offset value by subtracting the module temperature from the maximum internal temperature.

9. The memory system of claim 8, wherein the reference offset generation circuit includes:
a register configured to store the maximum internal temperature, the module temperature and the reference offset value; and
a calculation logic circuit configured to output the reference offset value by subtracting the module temperature from the maximum internal temperature.

10. The memory system of claim 8, wherein the control device is configured to receive the plurality of internal temperatures from the plurality of semiconductor memory devices, receive the module temperature from the module temperature sensor, and transfer the reference offset value to the memory controller.

11. The memory system of claim 1, wherein the memory controller includes:
a selector configured to select and output the maximum internal temperature of the plurality of internal temperatures; and
a reference offset generation circuit configured to generate the reference offset value by subtracting the module temperature from the maximum internal temperature.

12. The memory system of claim 11, wherein the memory controller is configured to receive the plurality of internal temperatures from the plurality of semiconductor memory devices and receive the module temperature from the module temperature sensor.

13. The memory system of claim 1, wherein the memory controller is configured to monitor the module temperature in real time and determine whether to update the reference offset value based on a change in the module temperature.

14. The memory system of claim 1, wherein the memory controller is configured to periodically receive the module temperature from the module temperature sensor and to update the reference offset value based on a difference between a previous module temperature and a present module temperature being greater than a reference value.

15. The memory system of claim 1, wherein the memory module further includes a serial presence detection (SPD) chip storing information characterizing the memory module, and the module temperature sensor is disposed in the SPD chip.

16. A memory module comprising:
a module substrate;
a control device mounted on the module substrate
a module temperature sensor mounted on the module substrate and configured to measure a module temperature; and
a plurality of semiconductor memory devices mounted on the module substrate and configured to store data, the plurality of semiconductor memory devices respectively including a plurality of temperature measurement circuits configured to measure a plurality of internal temperatures, wherein the plurality of internal temperatures are respective internal temperatures of the plurality of semiconductor memory devices,
wherein the memory module is configured to provide information on a reference offset value to a memory controller, the reference offset value corresponding to a maximum internal temperature of the plurality of internal temperatures subtracted by the module temperature,
wherein the control device includes:
a selector configured to select and output the maximum internal temperature, and
a reference offset generation circuit configured to generate the reference offset value by subtracting the module temperature from the maximum internal temperature, and
wherein the reference offset generation circuit includes:
a register configured to store the maximum internal temperature, the module temperature, and the reference offset value, and a calculation logic circuit configured to obtain the reference offset value by subtracting the module temperature from the maximum internal temperature.

17. The memory module of claim 16, wherein each semiconductor memory device of the plurality of semiconductor memory devices further includes, a chip offset generation circuit configured to generate, as a plurality of chip offset values, a chip offset value corresponding to each internal temperature of the plurality of internal temperatures subtracted by the module temperature, and wherein the chip offset generation circuit includes:

a second register configured to store the plurality of internal temperatures, the module temperature, and the plurality of chip offset values; and a second calculation logic circuit configured to subtract the module temperature from each internal temperature to output each chip offset value.

18. A method of operating a memory system, the method comprising:

measuring a module temperature using a module temperature sensor that is mounted on a memory module;

measuring a plurality of internal temperatures using a plurality of temperature measurement circuits that are respectively included in a plurality of semiconductor memory devices, wherein the plurality of internal temperatures are respective internal temperatures of the plurality of semiconductor memory devices;

receiving, from a plurality of chip offset generation circuits that are respectively included in the plurality of semiconductor memory devices, a plurality of chip offset values corresponding to the plurality of internal temperatures subtracted by the module temperature;

generating a reference offset value based on the plurality of chip offset values; and performing thermal throttling of the memory module based on the reference offset value and the module temperature.

* * * * *